(12) United States Patent
Khalil et al.

(10) Patent No.: US 11,038,474 B2
(45) Date of Patent: Jun. 15, 2021

(54) PHASED ARRAY AMPLIFIER LINEARIZATION

(71) Applicant: ANALOG DEVICES GLOBAL UNLIMITED COMPANY, Hamilton (BM)

(72) Inventors: Ahmed I. Khalil, Dracut, MA (US); Patrick Pratt, Mallow (IE)

(73) Assignee: ANALOG DEVICES GLOBAL UNLIMITED COMPANY, Hamilton (BM)

( * ) Notice: Subject to any disclaimer, the term of this patent is extended or adjusted under 35 U.S.C. 154(b) by 0 days.

(21) Appl. No.: 15/801,232

(22) Filed: Nov. 1, 2017

(65) Prior Publication Data

US 2019/0131934 A1    May 2, 2019

(51) Int. Cl.
| | |
|---|---|
| H04B 1/04 | (2006.01) |
| H01Q 3/28 | (2006.01) |
| H03F 1/32 | (2006.01) |
| H03F 3/68 | (2006.01) |
| H03F 3/24 | (2006.01) |
| H03F 3/189 | (2006.01) |

(52) U.S. Cl.
CPC ......... *H03F 1/3247* (2013.01); *H03F 1/3282* (2013.01); *H03F 3/189* (2013.01); *H03F 3/24* (2013.01); *H03F 3/68* (2013.01); *H04B 1/04* (2013.01); *H04B 1/0475* (2013.01); *H03F 2200/451* (2013.01); *H03F 2201/3236* (2013.01); *H04B 2001/0425* (2013.01)

(58) Field of Classification Search
CPC ........ H03F 1/3247; H03F 1/3282; H03F 1/32; H04B 1/04; H04B 2001/0425; H01Q 3/26; H01Q 3/28; H01Q 21/06
See application file for complete search history.

(56) References Cited

U.S. PATENT DOCUMENTS

| | | | |
|---|---|---|---|
| 4,462,001 A | 7/1984 | Girard | |
| 4,700,151 A | 10/1987 | Nagata | |
| 5,049,832 A | 9/1991 | Cavers | |
| 5,710,991 A * | 1/1998 | Lee | H03G 3/3047 455/126 |

(Continued)

FOREIGN PATENT DOCUMENTS

| | | |
|---|---|---|
| CN | 1860678 | 11/2006 |
| CN | 102460828 | 5/2012 |

(Continued)

OTHER PUBLICATIONS

Patrick Pratt, et al., U.S. Appl. No. 15/372,723, filed Dec. 8, 2016.

(Continued)

*Primary Examiner* — Pablo N Tran
(74) *Attorney, Agent, or Firm* — Knobbe, Martens, Olson & Bear, LLP

(57) ABSTRACT

Apparatus and methods provide predistortion for a phased array. Radio frequency (RF) sample signals from phased array elements are provided along return paths and are combined by a hardware RF combiner. Phase shifters are adjusted such that the RF sample signals are phase-aligned when combined. Adaptive adjustment of predistortion for the amplifiers of the phased array can be based on a signal derived from the combined RF sample signals.

22 Claims, 17 Drawing Sheets

(56) References Cited

U.S. PATENT DOCUMENTS

| | | | | |
|---|---|---|---|---|
| 5,715,527 A * | 2/1998 | Horii | H03G 3/3042 | 455/126 |
| 5,752,171 A * | 5/1998 | Akiya | H03G 3/3042 | 330/279 |
| 5,852,770 A * | 12/1998 | Kasamatsu | H03G 3/3047 | 455/126 |
| 6,230,031 B1 * | 5/2001 | Barber | H01Q 1/242 | 455/127.3 |
| 6,342,810 B1 | 1/2002 | Wright et al. | | |
| 6,459,334 B2 | 10/2002 | Wright et al. | | |
| 6,570,444 B2 | 5/2003 | Wright | | |
| 6,587,514 B1 | 7/2003 | Wright et al. | | |
| 6,697,436 B1 | 2/2004 | Wright et al. | | |
| 6,798,843 B1 | 9/2004 | Wright et al. | | |
| 6,943,627 B2 | 9/2005 | Leyonhjelm et al. | | |
| 6,973,138 B1 | 12/2005 | Wright | | |
| 7,058,369 B1 | 6/2006 | Wright et al. | | |
| 7,280,848 B2 | 10/2007 | Hoppenstein | | |
| 7,502,592 B2 * | 3/2009 | Yamamoto | H04B 7/0848 | 455/63.1 |
| 7,529,526 B2 * | 5/2009 | Brindle | H03G 3/3042 | 455/115.1 |
| 8,023,588 B1 | 9/2011 | Benson et al. | | |
| 8,243,851 B2 | 8/2012 | Kenington | | |
| 8,446,979 B1 | 5/2013 | Yee | | |
| 8,457,026 B1 | 6/2013 | Ho et al. | | |
| 8,477,871 B2 * | 7/2013 | Neumann | H03F 1/3247 | 375/295 |
| 8,489,041 B2 | 7/2013 | Teillet et al. | | |
| 8,982,994 B2 | 3/2015 | Egot et al. | | |
| 9,525,205 B2 | 12/2016 | Oh et al. | | |
| 9,791,552 B1 * | 10/2017 | Schuman | G01S 7/4026 | |
| 9,948,490 B2 | 4/2018 | Eitan et al. | | |
| 10,298,276 B2 | 5/2019 | Pratt et al. | | |
| 2007/0153884 A1 | 7/2007 | Balasubramanian et al. | | |
| 2008/0049868 A1 * | 2/2008 | Brobston | H03F 1/3247 | 375/297 |
| 2010/0166109 A1 | 7/2010 | Neumann et al. | | |
| 2010/0253426 A1 * | 10/2010 | Su | H03F 1/02 | 330/149 |
| 2010/0304695 A1 | 12/2010 | Persson et al. | | |
| 2010/0311353 A1 | 12/2010 | Teillet et al. | | |
| 2011/0065408 A1 | 3/2011 | Kenington et al. | | |
| 2013/0100991 A1 * | 4/2013 | Woo | H03F 3/24 | 375/219 |
| 2013/0163696 A1 | 6/2013 | Son et al. | | |
| 2014/0050282 A1 * | 2/2014 | Watanabe | H03F 1/3247 | 375/296 |
| 2015/0012786 A1 | 1/2015 | Varadarajan et al. | | |
| 2015/0103952 A1 | 4/2015 | Wang et al. | | |
| 2015/0332704 A1 | 11/2015 | Sun et al. | | |
| 2015/0349838 A1 * | 12/2015 | Petrovic | H03G 3/20 | 375/221 |
| 2016/0156375 A1 * | 6/2016 | Yang | H04B 1/0007 | 375/297 |
| 2016/0212677 A1 | 7/2016 | Chakraborty et al. | | |
| 2017/0141739 A1 | 5/2017 | Arnaud et al. | | |
| 2017/0279470 A1 | 9/2017 | Lee et al. | | |
| 2017/0290011 A1 * | 10/2017 | Kushnir | G01S 7/006 | |
| 2018/0053997 A1 * | 2/2018 | Noto | H03F 1/32 | |
| 2018/0167091 A1 | 6/2018 | Pratt et al. | | |
| 2018/0180713 A1 * | 6/2018 | Cohen | G01S 7/006 | |
| 2018/0191406 A1 * | 7/2018 | Jackson | H04B 7/01 | |
| 2019/0013580 A1 * | 1/2019 | Vigano | H01Q 3/2658 | |
| 2019/0089389 A1 * | 3/2019 | Gutman | H04B 1/0475 | |

FOREIGN PATENT DOCUMENTS

| | | |
|---|---|---|
| CN | 102460980 | 5/2012 |
| EP | 2 204 903 A1 | 7/2010 |
| EP | 3 267 579 A1 | 1/2018 |
| JP | H10-190361 A | 7/1998 |
| JP | 2008-166866 | 7/2008 |
| JP | 2016-195331 | 11/2016 |
| WO | WO 2016/167145 A1 | 10/2016 |
| WO | 2017/091119 A1 | 6/2017 |

OTHER PUBLICATIONS

Guan, Lei, et al. "High-performance digital predistortion test platform development for wideband RF power amplifiers." International Journal of Microwave and Wireless Technologies 5.2 (2013): 149-162.

Li, Hao, et al. "A fast digital predistortion algorithm for radio-frequency power amplifier linearization with loop delay compensation." IEEE Journal of selected topics in signal processing 3.3 (2009): 374-383.

Morgan, Dennis R., et al. "A generalized memory polynomial model for digital predistortion of RF power amplifiers." IEEE Transactions on signal processing 54.10 (2006): 3852-3860.

Partial European Search Report dated Mar. 21, 2019 for corresponding European Application No. EP 18 20 2360, 10 pages.

Office Action dated Oct. 21, 2019 for Japanese Patent Application No. 2018-204981, 6 pages.

濱中寿樹他 ビームフォーミング送信機用― 括非線形補償 DPD, 電子情報通信学会 技術研修報告、日本、一般社団法人電 子情報通信学会 The Institute of Electronics, Information and Communication Engineers, Jul. 2015, vol. 115 No. 144, p. 221-226.

Decision of Refusal dated Jun. 22, 2020 for Japanese Patent Application No. 2018-204981, 4 pages and 3 page translation.

European Search Report dated Jun. 26, 2019 for corresponding European Application No. EP 18 20 2360, 11 pages.

Chinese Office Action dated Jan. 20, 2021 for Chinese Patent Application No. 201811291940.5.

* cited by examiner

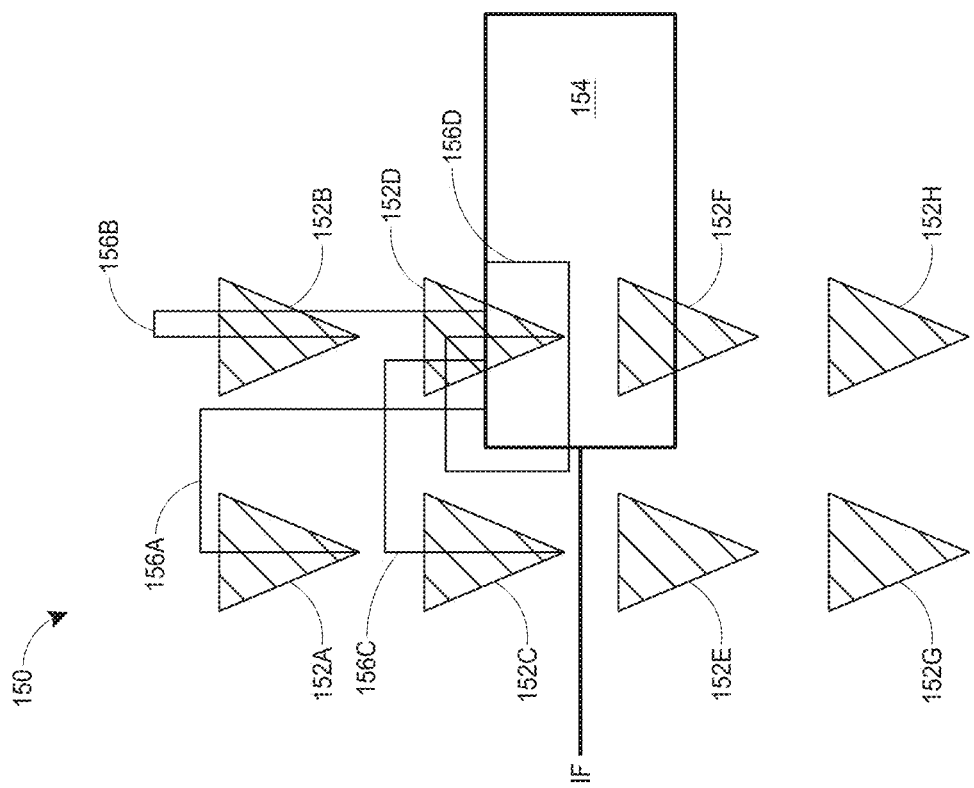

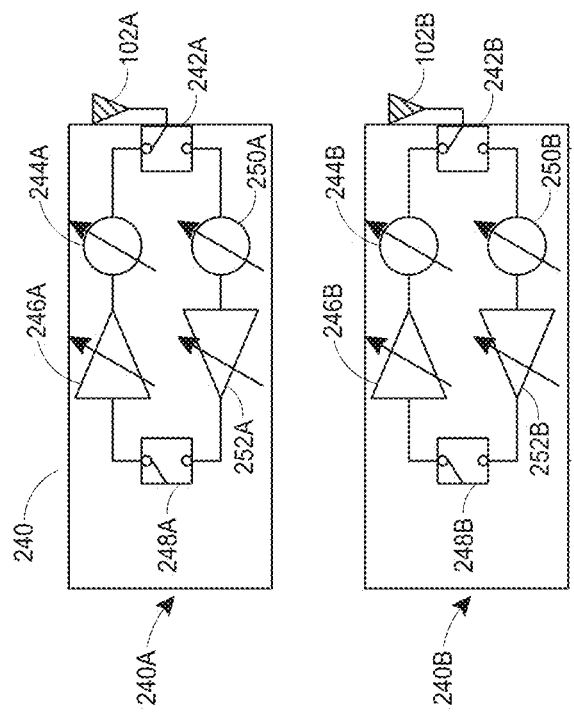
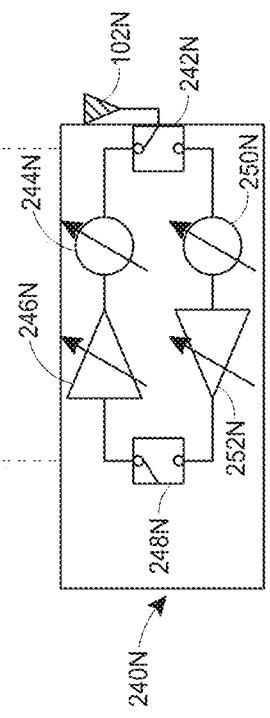
FIG. 2C
FIG. 2A
FIG. 2B

PHASED ARRAY AMPLIFIER LINEARIZATION

CROSS-REFERENCE TO RELATED APPLICATION

This application is related to copending application titled ANTENNA ARRAY CALIBRATION SYSTEMS AND METHODS, Ser. No. 15/611,289, filed on Jun. 1, 2017, the disclosure of which is hereby incorporated by reference in its entirety herein.

This application is also related to copending application titled SPATIAL DIGITAL PRE-DISTORTION, Ser. No. 15/372,723 filed Dec. 8, 2016.

BACKGROUND OF THE INVENTION

Field of the Invention

Embodiments of the invention generally relate to antennas, and in particular, to predistortion in connection with phased-array antennas.

Description of the Related Art

Radio frequency (RF) power amplifiers are used in a variety of applications, such as telecommunications, radars and the like. When a signal is amplified by an RF power amplifier, the amplified signal can become distorted due to non-linearities in RF power amplification. An upconversion process can also result in non-linearities. The presence of distortion can cause problems such as intermodulation distortion, out-of-band emissions, and interference.

One technique to linearize an RF power amplifier is by predistortion. With predistortion, the input signal to the RF power amplifier is predistorted in a manner that is complementary to the distortion added by the RF power amplifier to reduce the resulting distortion in the output of the RF power amplifier. Such techniques can also be applied to linearize the combination of an upconverter and RF power amplifier.

However, conventional predistortion techniques cannot be used with analog beamformers. What is needed is a technique to apply predistortion to the phased array amplifier of an analog beamformer.

SUMMARY OF THE DISCLOSURE

One embodiment includes an apparatus for radio frequency (RF) linearization of multiple amplifiers of a phased array, wherein the apparatus includes: a plurality of return paths configured to carry at least RF sample signals of a plurality of RF power amplifiers; a hardware RF power combiner configured to combine the RF sample signals to generate a combined signal; a plurality of return-side phase shifters configured to adjust a phase shift of the RF sample signals such that the RF sample signals are phase aligned at the hardware RF power combiner; and a predistorter configured to predistort an input signal to generate a predistorted signal and configured to adapt predistortion coefficients for predistortion based at least partly on observations of a signal derived from the combined signal.

One embodiment includes a method of linearization of multiple amplifiers of a phased array, wherein the method includes: phase shifting radio frequency (RF) sample signals of a plurality of RF power amplifiers such that the RF sample signals are phase aligned at a hardware RF power combiner; combining the RF sample signals the hardware RF power combiner to generate a combined signal; and predistorting an input signal with a predistorter to generate a predistorted signal, wherein predistortion coefficients are based at least partly on comparisons between portions of the input signal and corresponding portions of a signal derived from the combined signal.

One embodiment includes a phased array element for a phased array, wherein the phased array element includes: a switch for switching an antenna element between either a transmit side or a receive side for time-division duplex operation; and a return path separate from a transmit path, wherein the return path is configured to provide a radio frequency (RF) sample of a transmitted signal, wherein the return path further comprises a phase shifter configured to adjust a phase of the RF sample.

BRIEF DESCRIPTION OF THE DRAWINGS

These drawings and the associated description herein are provided to illustrate specific embodiments of the invention and are not intended to be limiting.

FIG. 1B is a schematic block diagram of an asymmetric routing schematic for a 2-by-8 antenna array according to another embodiment.

FIG. 2A is an illustration of a horizontal wavefront according to an embodiment.

FIG. 2B is an illustration of an angled wavefront according to an embodiment.

FIG. 2C is a schematic block diagram of a series of transceivers according to an embodiment.

DETAILED DESCRIPTION OF THE PREFERRED EMBODIMENT

Figure 1A:
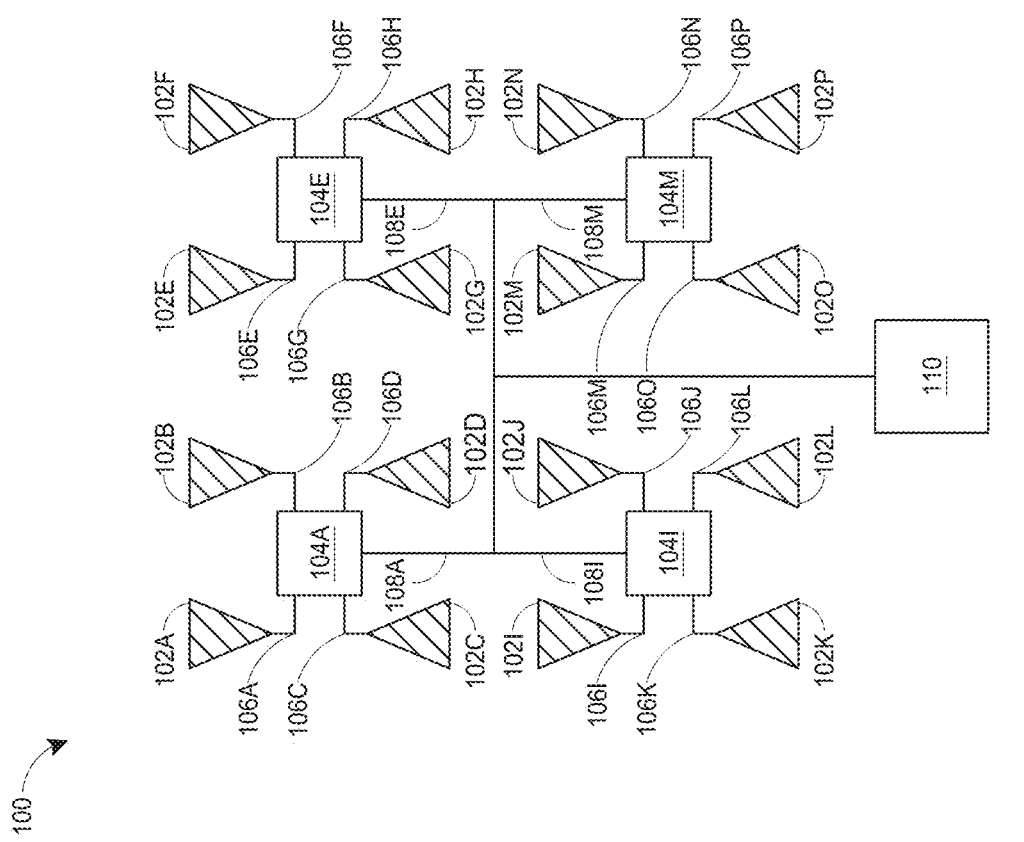
FIG. 1A is a schematic block diagram of a symmetric routing schematic for a 4-by-4 antenna array according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

An antenna array can enable a beamformer to steer an electromagnetic radiation pattern in a particular direction, which generates a main beam in that direction and side lobes in other directions. The main beam of the radiation pattern is generated based on constructive inference of the signals based on the transmitted signals' phases. Furthermore, the amplitudes of the antenna elements determine side-lobe levels. A beamformer can generate desired antenna patterns by, for example, providing phase shifter settings for the antenna elements. However, over time, the amplitudes of signals and the relative phases among the antenna elements can drift from the values set when the antenna was originally calibrated. The drift can cause the antenna pattern to degrade, which can, for example, reduce the gain in a main lobe. Thus, what is needed is a way to accurately measure and control the phase and amplitude of antenna elements in an array system even after an antenna array has been fielded. Furthermore, the calibration process itself can be relatively labor intensive, time consuming, and costly. Thus, there is a need for a method of calibration without the need for expensive test equipment and facilities and having to relocate the antenna to a particular location. These disclosed techniques are also applicable to the manufacturing test environment and can be used to speed production, thus lowering costs. In one embodiment, the calibration data is used by the beamformer and combined with other data, such as pre-calculated or pre-stored antenna pattern data, to generate appropriate settings for beamforming.

The present disclosure enables an antenna array to perform calibration using relative measurements of phase and/or absolute measurements of amplitude. A probe is placed between antenna elements and the phase and/or amplitude of the antenna elements are measured. Then, the phase or amplitude can be assessed to determine adjustments that are made to the transmitter, receiver, or transceiver connected to the antenna elements. In some embodiments, the antenna elements can transmit signals, and the phase of one or more antenna elements can be adjusted until a relatively high or maximum and/or relatively low or minimum power level is reached. Upon determining a relatively high or maximum power level, the phase adjuster or shifter values are recorded as those corresponding to in phase, and for a relatively low or minimum power level, the phase values are recorded as 180 degrees out of phase. Although embodiments describe the use of a probe, it is appreciated that other structures (e.g. conductors) that can transmit and/or receive signals may also be used (e.g. slots, monopole, small patches, other coupling structures, etc).

In some embodiments, the probe should be disposed symmetrically between the antenna elements. For example, if there are two antenna elements, the probe can be placed in between the two antenna elements. In another example, if there are four antenna elements, the probe can be placed diagonally between the four antenna elements equidistant from each of the four antenna elements. Placing the probe symmetrically between antenna elements reduces or eliminates the possible variation that may occur in the propagation of the radiation pattern to or from the probe and the antenna elements.

In some embodiments, the antenna elements can be used to transmit signals to the probe, the probe receiving the transmitted signals. The probe can detect power (e.g. by using a power detector) or detect both power and phase (e.g. by using a mixer). Alternatively, the probe can be used as a transmitter, transmitting a signal to the antenna elements, where the antenna elements receive the transmitted signal.

Using a single probe to calibrate multiple antennas is advantageous. Having a single probe that may be used to transmit to the antenna elements and/or receive signals from antenna elements may itself introduce variation to the signal. However, since the same probe and components connected to the probe (e.g. mixer) are used to measure the signal, there is advantageously no part-to-part or channel-to-channel variation with the disclosed techniques. For example, the probe and the components connected to the probe will introduce the same variation to a signal received at the probe from a first and second antenna element.

By contrast, couplers used to measure phase and amplitude of a signal to calibrate antenna elements would introduce variation. A separate coupler would be connected to the transmit path of each antenna element. Then, the signal would travel along the signal route to components connected to each coupler. The routing path from each coupler to their associated connected components would introduce channel to channel variation. Each coupler may be connected to its own set of components, which despite possibly being of the same kind of components, the components themselves introduce part to part variability. Furthermore, the couplers themselves use additional hardware such as switches. The couplers themselves, often made of metallic substances, may interfere with the radiation signal making it harder to obtain higher isolation between the antenna elements. These drawbacks are reduced or eliminated by embodiments of the invention.

Embodiments of the present disclosure including using a probe disposed between antenna elements are advantageous in that the probes can be used to calibrate the array based on near field radiation measurements. Thus, the array can be calibrated without the need for far field measurements. Typically, electromagnetic anechoic chambers, (also called echo-free chambers) can be used to simulate an open space situation. The time and space in these chambers may be difficult to schedule, may be expensive, and time consuming. However, embodiments of the present disclosure avoid the need of having to place the antenna in an anechoic chamber because near-field measurements are used instead of far-field measurements. Furthermore, anechoic chambers may be practical for initial calibration, but not for later calibration. Some embodiments of the antenna array of the present disclosure may be calibrated repeatedly and at the field. The probes can be permanently placed in between antenna elements. The antenna array may be configured to allow temporary installment of the probes in between the antenna elements as well. Some embodiments of the near-field calibration of the present disclosure may also be helpful for small signal difference.

The calibration method and system can be used to calibrate arrays of different sizes. For example, the system can calibrate a planar array by calibrating a first set of antenna elements (or calibration group) that are equidistant to one probe, then calibrating a second set of antenna elements equidistant to another probe where the first and second set of antenna elements share at least one antenna element. Then, the shared antenna element can be used as a reference point to calibrate the other antenna elements.

Although the disclosure may discuss certain embodiments with the probe as the receiver and the antenna elements as the transmitter, it is understood that the probe can act as a transmitter and the antenna elements as a receiver, and vice versa.

FIG. 1A is a schematic block diagram of a symmetric routing schematic 100 according to an embodiment. The symmetric routing schematic 100 includes antenna elements, 102A, 102B, 102C, 102N, 102E, 102F, 102G, 102H, 102I, 102J, 102K, 102L, 102M, 102N, 102O, and 102P (collectively referred to herein as 102). The symmetric routing schematic 100 also includes a chip 104A, 104E, 104I, and 104M (collectively referred to herein as 104). The symmetric routing schematic 100 includes a transceiver 110 and routing paths 106A, 106B, 106C, 106D, 106E, 106F, 106G, 106H, 106I, 106J, 106K, 106L, 106M, 106N, 106O, 106P, 108A, 108E, 108I, and 108M (collectively referred to herein as 106) from the transceiver 110 to the antenna elements 102.

FIG. 1A refers to a symmetric routing schematic 100 for a 4-by-4 antenna array. The schematic refers to symmetric routing because the routes on the routing paths 106 from the transceiver 110 to the antenna elements 102 are of the same distance. For example, the routing path from transceiver 110 to antenna element 102A is a combination of the routing paths 108A and 106A, while the routing path from transceiver 110 to antenna element 102B is a combination of the routing paths 108A and 106B. The routing paths are generated to minimize variation in the distance the signal travels from the transceiver 110 to the antenna element 102. This type of configuration helps to mitigate the variation that may cause difficulties in calibration due to different lengths of routing paths the signal travels from the transceiver 110 to the antenna element 102.

The antenna elements 102 may be radiating elements or passive elements. For example, the antenna elements 102 may include dipoles, open-ended waveguides, slotted waveguides, microstrip antennas, and the like. Although some embodiments illustrate a certain number of antenna elements 102, it is appreciated that the some embodiments may be implemented on an array of two or more antenna elements.

FIG. 1B is a schematic block diagram of an asymmetric routing schematic 150 for a 2-by-4 antenna array according to another embodiment. The asymmetric routing schematic 150 includes antenna elements 152A, 152B, 152C, 152D, 152E, 152F, 152G, and 152H (collectively referred to herein as 152). The asymmetric routing schematic 150 also includes a chip 154. The asymmetric routing schematic 150 includes routing paths 156A, 156B, 156C, and 156D (collectively referred to herein as 156) from the chip 154 to the antenna elements 152. FIG. 1B is directed to asymmetric routing because the routing paths 156 from the chip 154 to the antenna elements 152 are different in lengths. Thus, the phase and amplitude varies differently from channel to channel. For example, the transmitted signal at the antenna element 152 may be different from element to element even though the same signal was transmitted from the chip 154. In some embodiments, the received signal at the antenna elements 152 may be the same, but different when received at the chip 154 as a result of the different lengths of the routing paths 156.

FIG. 2A is an illustration of a horizontal wavefront 200 according to an embodiment. Each antenna element 102 may radiate in a spherical radiation pattern. However, the radiation patterns collectively generate a horizontal wavefront 204. The illustration 200 includes antenna elements 102A, 102B, 102C, 102N, 102M-1 and 102M. The antenna elements 102A, 102B, 102C, and 102N may be arranged linearly, where the elements are arranged on a straight line in a single dimension. In this configuration, the beam may be steered in one plane. The antenna elements may also be arranged planarly, arranged on a plane in two dimensions (N direction and M direction). In this planar configuration, the beam may be steered in two planes. The antenna elements may also be distributed on a non-planar surface. The planar array may be rectangular, square, circular, or the like. It is appreciated that the antenna may be arranged in other configurations, shapes, dimensions, sizes, types, other systems that can implement an antenna array, and the like. The illustration of the horizontal wavefront 200 shows each of the antenna elements 102 transmitting a signal 202A, 202B, 202C, 202N, 202M-1, and 202M (collectively referred to herein as 202) creating a horizontal wavefront 204. The illustration of FIG. 2A illustrates an antenna array creating a main beam that points upward, as shown by the horizontal wavefront 204. The phases from the antenna elements 102 are constructively interfering in the upward direction.

FIG. 2B is an illustration of an angled wavefront 220 according to an embodiment. The illustration of the angled wavefront 220 includes antenna elements 102A, 102B, 102C, 102N, 102M-1 and 102M. The antenna elements may be arranged similarly to that described for FIG. 2A. The illustration of an angled wavefront 220 shows the antenna elements 102 transmitting a signal 222A, 222B, 222C, 222N, 222M-1, and 222M (collectively referred to herein as 222) creating a wavefront 224 that propagates at an angle, different from the direction of the wavefront 204 in FIG. 2A. The phases of the signals 222 are constructively interfering in the direction that the angled wavefront 220 is traveling (e.g. up-right direction). Here, each of the phases of the antenna elements 102 may be shifted by the same degree to constructively interfere in a particular direction.

The antenna elements 102 can be spaced apart equidistant from one another. In some embodiments, the antenna elements 102 are spaced at different distances from each other, but with a probe equidistant from at least two antenna elements 102.

Although the disclosure may discuss certain embodiments as one type of antenna array, it is understood that the embodiments may be implemented on different types of antenna arrays, such as time domain beamformers, frequency domain beamformers, dynamic antenna arrays, active antenna arrays, passive antenna arrays, and the like.

FIG. 2C is a schematic block diagram of a series of transceivers 240A, 240B, 240N (collectively referred to herein as 240) according to an embodiment. In some embodiments, a single transceiver 240 feeds to a single antenna element 102. However, it is appreciated that a single transceiver 240 may feed to multiple antenna elements 102, or a single antenna element 102 may be connected to a plurality of transceivers 240. Furthermore, it is appreciated that the antenna element 102 may be linked to a receiver and/or a transmitter.

In some embodiments, the transceiver 240 may include a switch 242A, 242B, 242N (collectively referred to herein as 242) to switch the path from the antenna element 102 to the receiver or the transmitter path. The transceiver 240 includes another switch 248A, 248B, 248N (collectively referred to herein as 248) that switches the path from the signal processor (not shown) to the receiver or the transmitter path. The transmitter path has a phase adjuster 244A, 244B, 244N (collectively referred to herein as 244) and a variable gain amplifier 246A, 246B, 246N (collectively referred to herein as 246). The phase adjuster 244 adjusts the phase of the transmitted signal at the antenna element 102 and the variable gain amplifier 246 adjusts the amplitude of the transmitted signal at the antenna element 102. Although the embodiments describe the transceiver 240 including a phase adjuster 244 and a variable gain amplifier 246, other components can be used to adjust the magnitude of the signal and/or the phase of the signal. Furthermore, although a switch is shown to switch from the transmitter path to the receive path, other components can be used, such as a duplexer.

The receiver path may also have a phase adjuster 250A, 250B, 250N (collectively referred to herein as 250), and a variable gain amplifier 252A, 252B, 252N (collectively referred to herein as 252). The phase adjuster 250 and the variable gain amplifier 252 can be used to adjust the received signal from the antenna element 102 before going to the signal processor (not shown).

Figure 2D:
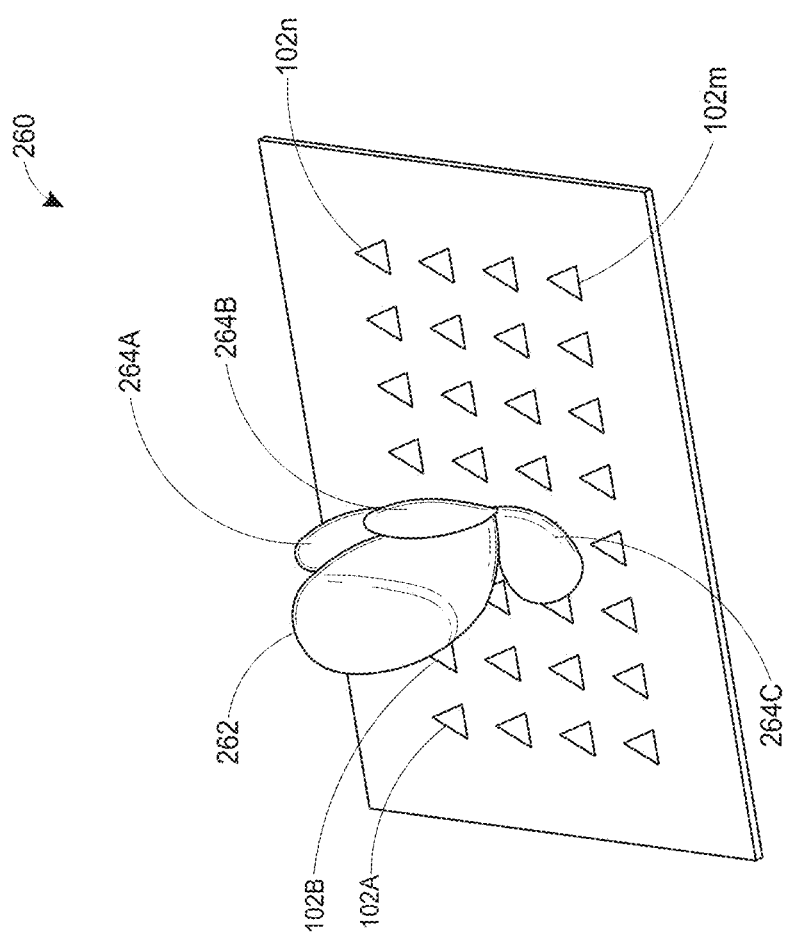
FIG. 2D is an illustration of a planar array and an associated electromagnetic pattern according to an embodiment.

FIG. 2D is an illustration of a planar phased array 260 and an associated electromagnetic pattern according to an embodiment. FIG. 2D includes antenna elements 102A, 102B, 102N, 102M-1, and 102M. FIG. 2D also includes a beam pattern with a main beam 262, and side lobes 264A, 264B, 264C. The antenna elements 102 are transmitting a signal where the phase of the signal is constructively interfering in the direction of the main beam 262. The precision of the amplitude of the antenna elements 102 controls the side-lobe levels. For example, the more uniform the amplitudes of the transmitted signals from the antenna elements 102 are, the lower the side lobe levels will be. The antenna elements 102 may be disposed on a single die, or multiple dies.

Figure 3A:
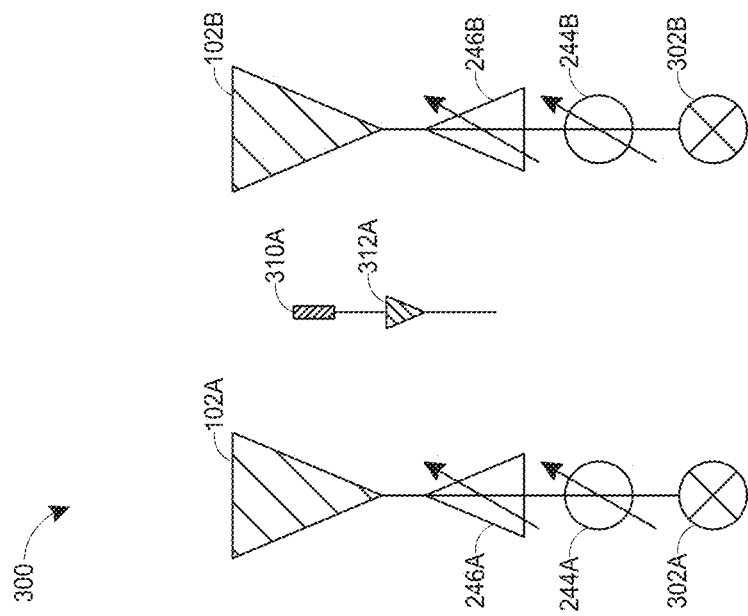
FIG. 3A is a schematic block diagram of a probe with a power detector disposed between two antenna elements according to an embodiment.

FIG. 3A is a schematic block diagram 300 of a probe 310A with a power detector 312A disposed between two antenna elements 102A, 102B according to an embodiment. In this block diagram 300, the probe is disposed equidistant between the two antenna elements 102A, 102B. The probe 310A may be a slot, a probe, a coupling element, any component that can be used to detect signals, or the like. The probe can be used as a transmitter.

Figures 1, 3B:
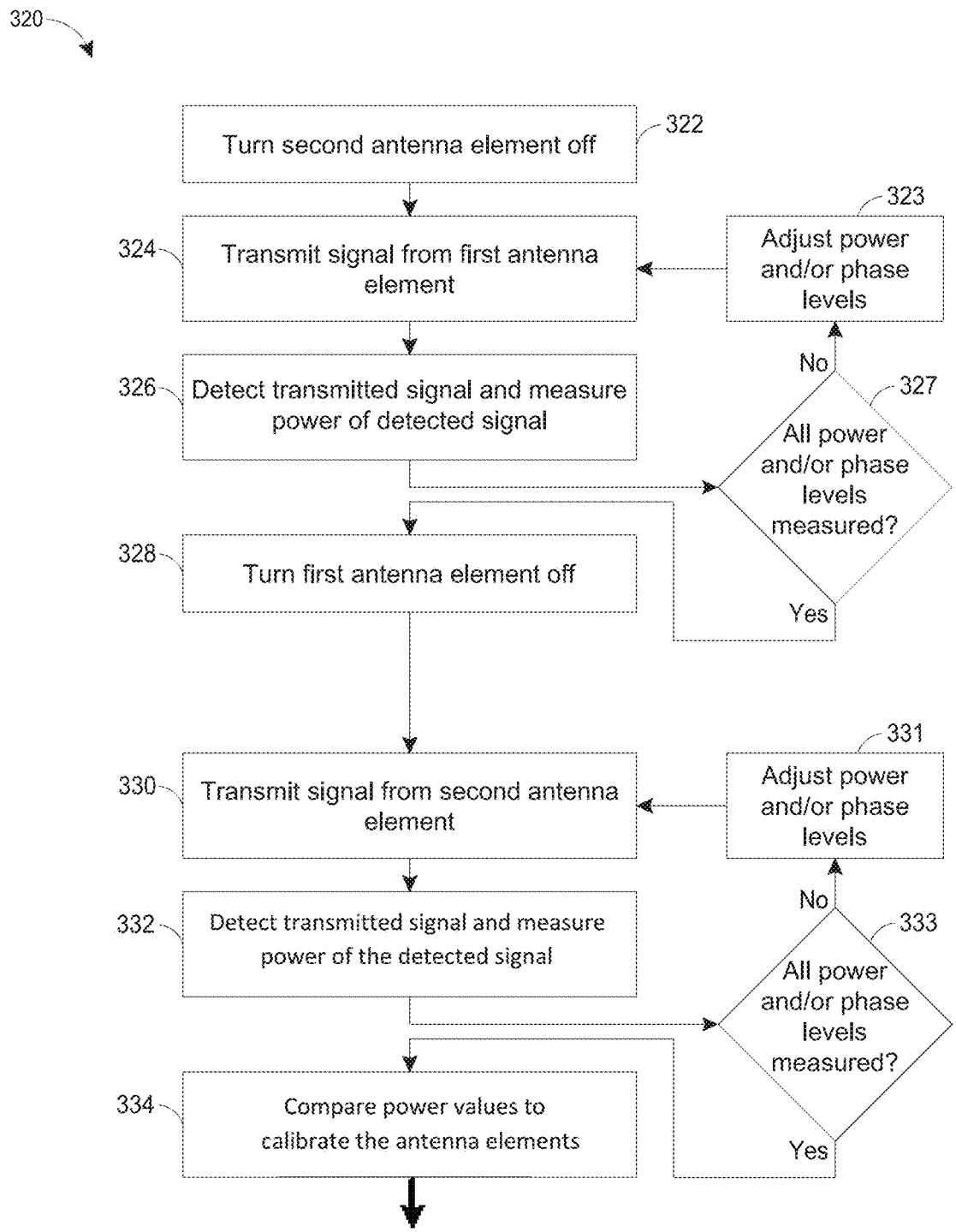
FIGS. 3B-1 and 3B-2 are flow diagrams for calibration using a probe with a power detector disposed between two antenna elements according to an embodiment.
Figures 2, 3B:
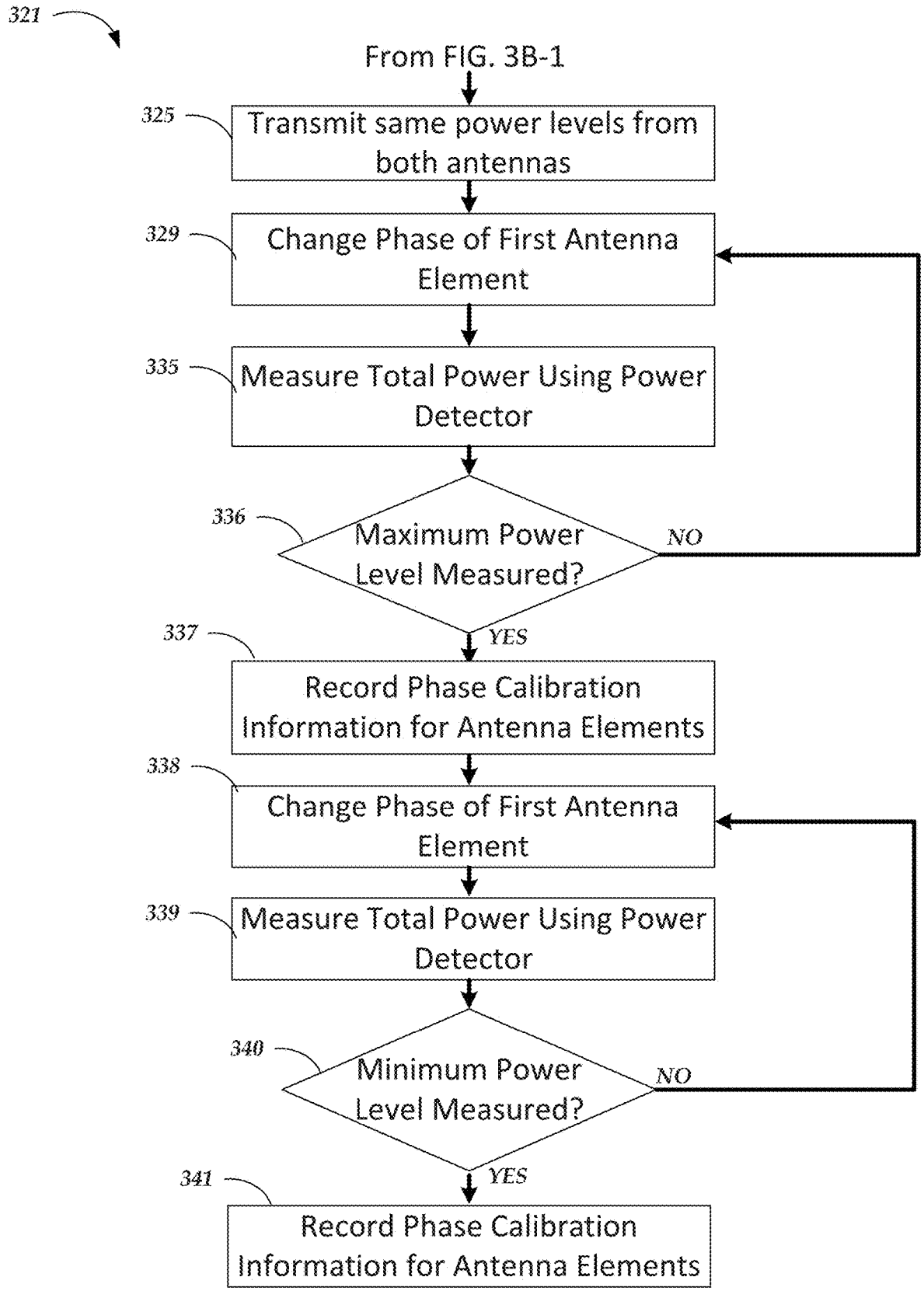

FIGS. 3B-1 and 3B-2 is a flow diagram for calibration using a probe with a power detector disposed between two antenna elements according to an embodiment.

FIG. 3B-1 illustrates a flow diagram 320 for measuring and comparing all power levels for the two antenna elements 102A, 102B. At block 322, the transmitter tied to the antenna element 102B is turned off. At block 324, a signal is transmitted from the first antenna element 102A. A signal is generated from the mixer 302A, amplified by the variable gain amplifier 246A, shifted in phase by the phase adjuster 244A, and transmitted from the antenna element 102A. At block 326, the probe 310A detects the transmitted signal from the antenna element 102A and the power detector 312A detects power values of the detected signal. At block 327, the system can determine whether all power and/or phase levels are measured. If yes, then the system can continue to block 328. If not, then the power and/or phase can be adjusted in block 323, and proceed back to block 324. For example, a combination of each power level and each phase level can be measured. In some embodiments, the phase and amplitude are decoupled such that each power level can be measured and each phase level measured independently without having to measure every combination of each power level and each phase level.

At block 328, the transmitter tied to the antenna element 102A is turned off. At block 330, a signal is transmitted from the second antenna element 102B. A signal is generated from the mixer 302B, amplified by the variable gain amplifier 246B, shifted in phase by the phase adjuster 244B, and transmitted from the antenna element 102B. At block 332, the probe 310A detects the transmitted signal from the antenna element 102B and the power detector 312A detects power values of the detected signal.

At block 334, once the detected signals from the transmitted signals of antenna elements 102A and 102B are stored, the power values are compared to calibrate the transmitter connected to the antenna element 102A relative to the transmitter connected to the antenna element 102B, and/or vice versa. The power values are calibrated by adjusting the gain of the variable gain amplifier 246A and/or 246B. In some embodiments, the calibration is performed during, before, or after other blocks in FIG. 3B. After comparing power values to calibrate the antenna elements at block 334, the flow can continue to FIG. 3B-2.

FIG. 3B-2 illustrates a flow diagram 321 for calibrating the phase for the two antenna elements 102A, 102B. At block 325, a signal of the same power level is transmitted from both antenna elements 102A, 102B. This can be achieved using data obtained from the steps in FIG. 3B-1. At block 329, the phase of the first antenna element 102A is changed. Then at block 335, the total power can be measured by a power detector 312A. The system determines whether the maximum power level is measured at block 336. If not, then the system continues to change the phase of the first antenna element 102A and continues the flow diagram from block 329. If the maximum power level is measured at block 336, then the phase can be determined to be in an in-phase condition. The phases that provide the maximum power level at block 336 is recorded for the antenna elements at block 337.

At block 338, the phase of the first antenna element 102A is changed, and at block 339, the total power is measured using the power detector 312A. At block 340, the system determines whether the minimum power level is measured. If not, then the phase of the first antenna element 102A is changed and the flowchart continues from block 338. If the minimum power level is measured, then the system records the phase calibration information for the antenna elements at block 341. This can be considered a 180 degrees out of phase condition.

Figure 3C:
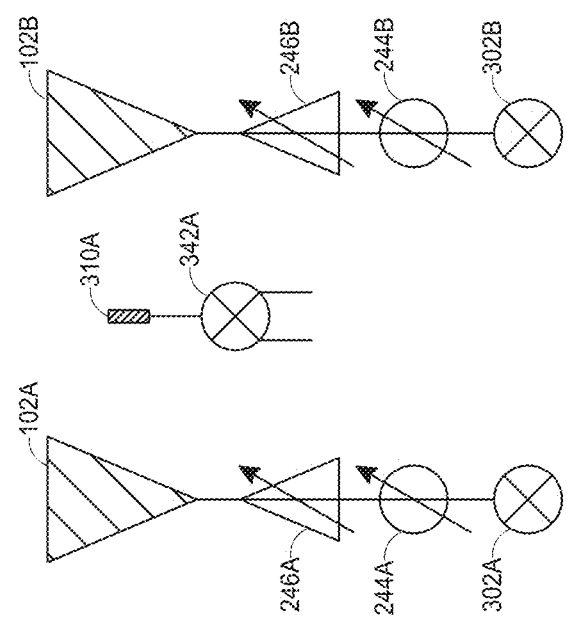
FIG. 3C is a schematic block diagram of a probe with a mixer disposed between two antenna elements according to an embodiment.

FIG. 3C is a schematic block diagram 330 of a probe 310A with a mixer 342A disposed between two antenna elements 102A, 102B according to an embodiment. The probe 310A may be disposed equidistant from the antenna elements 102A and 102B. The probe 310A is connected to the mixer 342A.

Figure 3D:
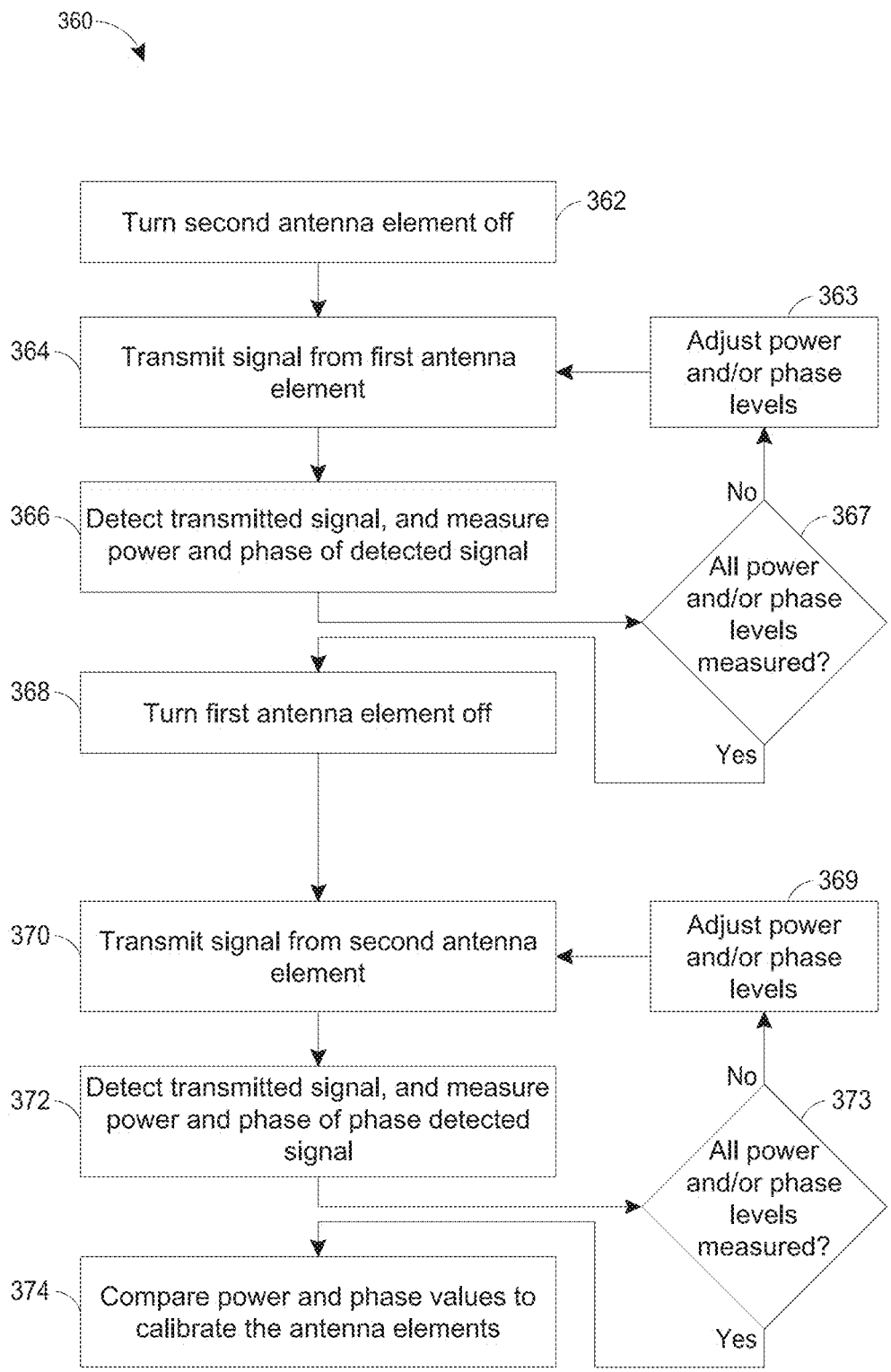
FIG. 3D is a flow diagram for calibration using a probe with a mixer disposed between two antenna elements according to an embodiment.

FIG. 3D is a flow diagram 360 for calibration using a probe with a mixer disposed between two antenna elements according to an embodiment. The mixer can be used to measure phase and/or amplitude. At block 362, the transmitter connected to antenna element 102B is turned off. At block 364, a signal is generated from the mixer 302A, amplified by the variable gain amplifier 246A, phase shifted by the phase adjuster 244A, and transmitted by the antenna element 102A. At block 366, the probe 310A detects the transmitted signal and using the mixer, the signal processor measures and records the amplitude and phase values. At block 367, the system can determine whether all power and/or phase levels have been measured. If yes, then the system can proceed to block 368. If no, then the system can adjust power and/or phase levels in block 363, and return to block 324.

At block 368, the transmitter connected to the antenna element 102A is turned off. At block 370, a signal is generated from the mixer 302B, amplified by the variable gain amplifier 246B, shifted in phase by the phase adjuster 244B, and transmitted by the antenna element 102B. At block 372, the probe 310A detects the signal, the mixer mixes the signal, and the signal processor measures and records the phase and amplitude values. At block 373, the system can determine whether all power and/or phase levels have been measured. If yes, then the system can proceed to block 374. If no, then the system can adjust power and/or phase levels in block 369, and return to block 370.

At block 374, based on a comparison between the amplitudes of the signals transmitted by the antenna element 102A and 102B, the variable gain amplifiers 246A, 246B are adjusted such that the amplitudes are calibrated to transmit substantially the same power based on the same signal generated. Furthermore, based on a correlation between the phases of the signals transmitted by the antenna element 102A and 102B, the phase adjusters 244A and 244B are adjusted such that the phases are calibrated to transmit at substantially the same phase for the same generated signal.

The values of the variable gain amplifier 246A, 246B and/or the phase adjusters 244A, 244B may be controlled using a digital command sent through the beam steering interface, such as the beam steering chip or the signal processor. The phase adjuster may be an n-bit phase adjuster providing control of the phase in a total of a particular number of phase degrees. Thus, the calibration process may be calibrated to be the state that allows for the closest phase value. In some embodiments, the calibration is performed during, before, or after other blocks in FIG. 3D.

Figure 4:
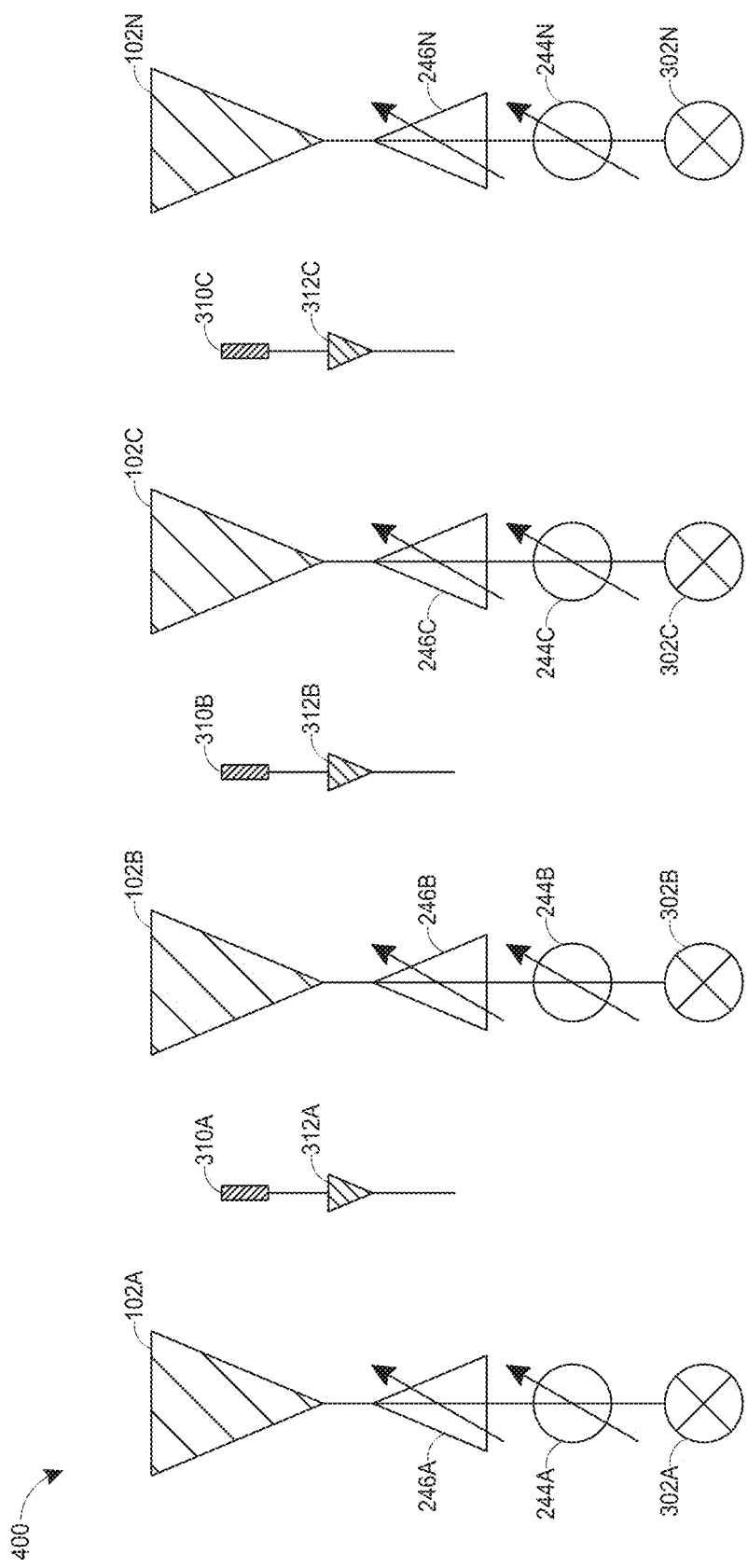
FIG. 4 is a schematic block diagram of probes disposed between four antenna elements according to an embodiment.

FIG. 4 is a schematic block diagram 400 of probes 310A, 310B, 310C disposed between four antenna elements 102A, 102B, 102C, 102N according to an embodiment. In the block diagram 400, probe 310A is disposed equidistant from antenna element 102A and antenna element 102B. The probe 310B is disposed equidistant from antenna element 102B and antenna element 102C. The probe 310C is disposed equidistant from antenna element 102C and antenna element 102N. The antenna elements 102A, 102B, 102C, and 102N are disposed linearly.

In this embodiment, antenna elements 102A and 102B are calibrated first. The transmitters connected to the antenna elements 102B, 102C, and 102N are turned off. The mixer 302A generates a signal, the signal shifted in phase by the phase adjuster 244A, the signal amplified by a variable gain amplifier 246A, and transmitted from the antenna element 102A. The probe 310A receives the signal. Next, the antenna 102B transmits a signal that the same probe 310A detects. In this embodiment, the probe 310A is connected to a power detector 312A. Antenna elements 102A and 102B are calibrated similar to the process described in FIG. 3A. However, the probe 310A may be connected to mixers and may be calibrated similar to the process described in FIG. 3B. Other ways of calibration are possible. For example, other components may be connected to the probe 310A to measure phase and/or amplitude. Furthermore, other methods of calibration may be used using relative measurements of phase and/or amplitude.

Next, antenna elements 102B and 102C are calibrated. Then, 102C and 102N are calibrated. In this embodiment, the calibration occurs serially. However, calibration may occur in different time steps. For example, when antenna element 102B is transmitting a signal to calibrate with antenna 102A, not only can probe 310A be detecting the signal, but also probe 310B may detect the signal. Thus, while antenna elements 102A and 102B are being calibrated, the calibration between antenna elements 102B and 102C can begin in parallel. In this embodiment, neighboring antenna elements are being calibrated. However, it is appreciated that any set of antenna elements that are equidistant from the probe can be calibrated. For example, the first and fourth antenna element 102A, 102N can be calibrated with a probe 310B between the second and third antenna element 102B, 102C.

Figure 5A:
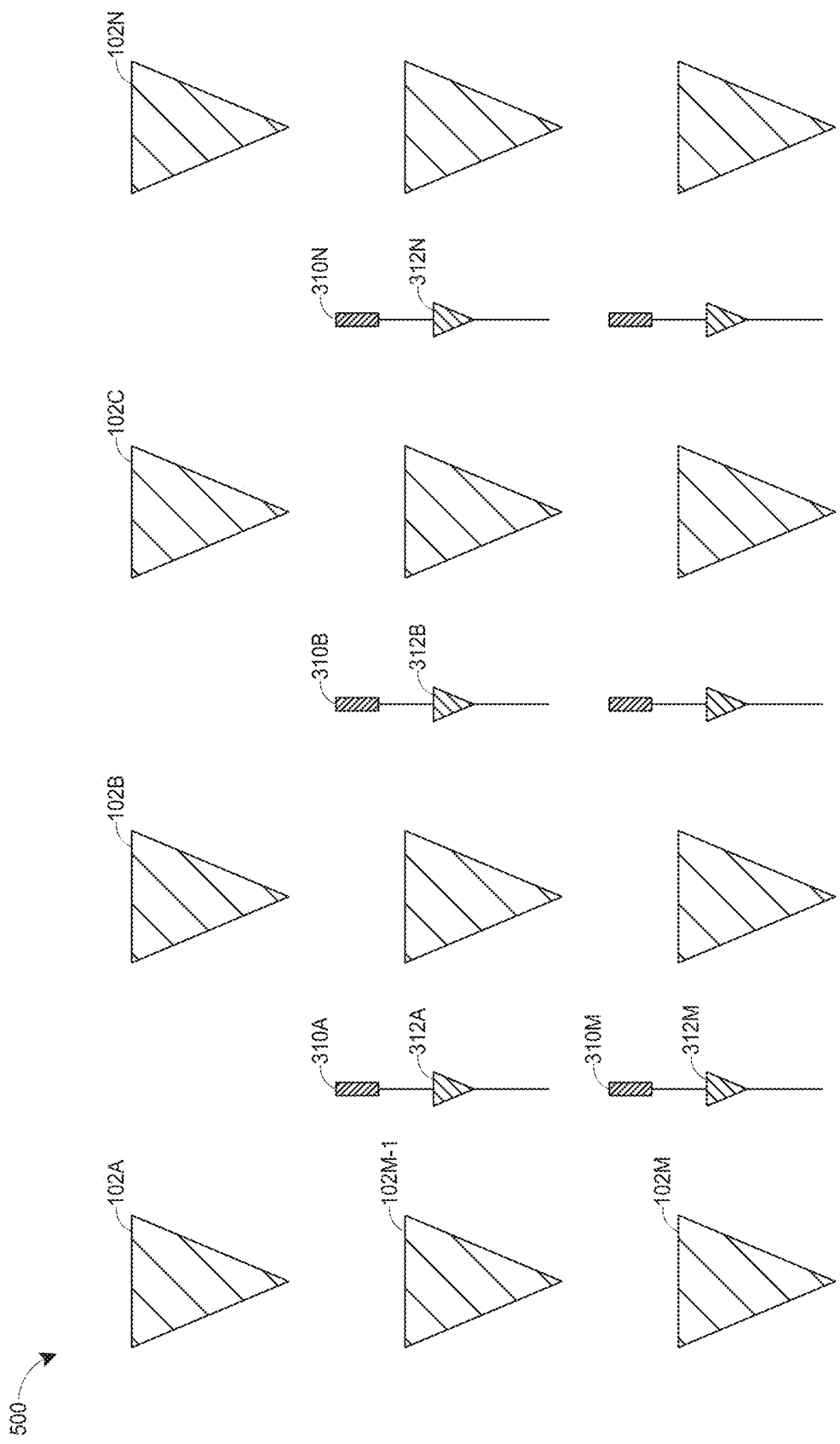
FIG. 5A is a schematic block diagram of probes disposed between an array of three by four antenna elements according to an embodiment.

FIG. 5A is a schematic block diagram of probes disposed between an array of three by four antenna elements according to an embodiment. The probes 310A, 310B, 310C . . . 310M (collectively referred to herein as 310) are disposed symmetrically between a set of four antenna elements 102. In this embodiment, the probe 310 is equidistant from each antenna element 102 in the set of four antenna elements. However, it is appreciated that the probe 310 may be placed at some distance that is equidistant from at least two antenna elements 102.

Figure 5B:
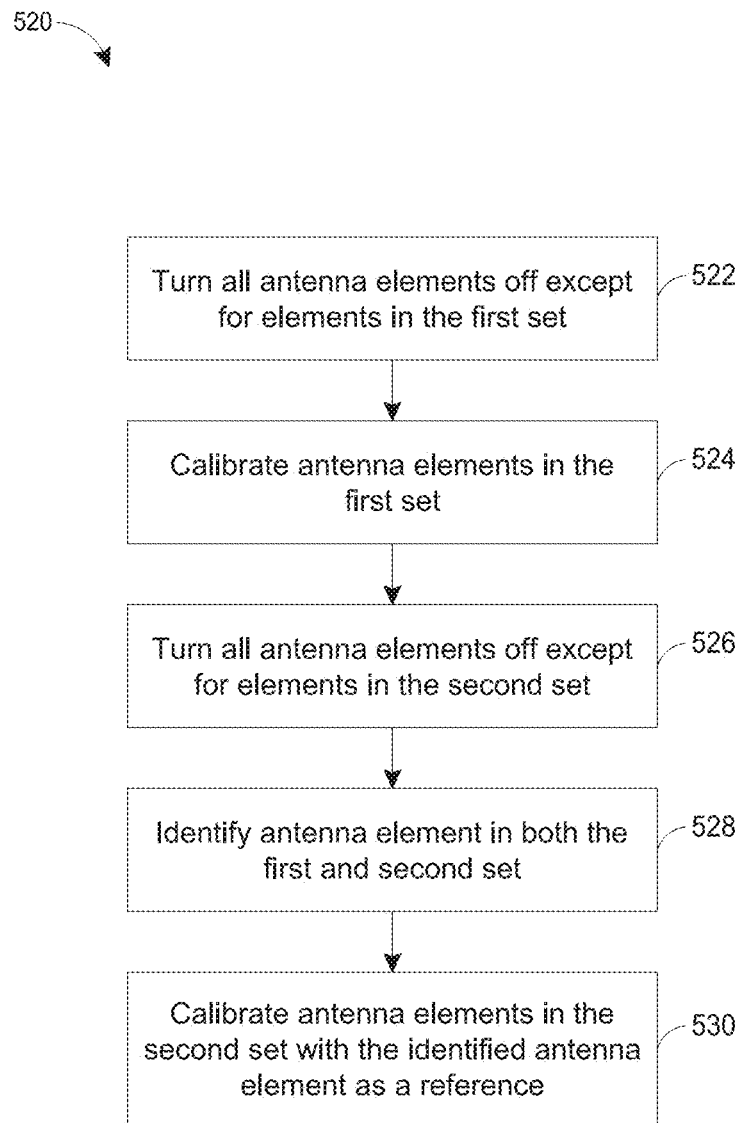
FIG. 5B is a flow diagram for calibration using probes disposed between an array of three by four antenna elements according to an embodiment.

FIG. 5B is a flow diagram for calibration using probes disposed between an array of three by four antenna elements according to an embodiment.

At block 522, all transmitters connected to all antenna elements 102 are turned off. At block 524, the first set of four antenna elements is calibrated together. Then, the first antenna element 102A transmits a signal. The probe 310A receives this signal, measures the power using the power detector 312A, and records the power. This is repeated for the other three antenna elements 102 that are equidistant from the first probe 310A. Then, the gain of each antenna element 102 within the set of four antenna elements is adjusted to be calibrated in relation to one another. Then, all four antenna elements 102 transmit a signal, the phase adjusted, and the phase recorded to identify the phase configurations that provide maximized power (e.g. the phase values are equal). The same test is performed for when the power is minimized (e.g. phases are 180 degrees apart). Calibration can be performed in a similar manner to that described in FIG. 3A, 3B, and other ways described in this disclosure.

Although the disclosure may discuss certain embodiments as calibrating four antennas at once, it is understood that the embodiments may be implemented using a different number of transmitters, antenna elements, probes, and the like. For example, the power can be calibrated for four antenna elements at once (e.g. once power is recorded for four antenna elements, the gain for each of the four antenna elements can be adjusted to meet a reference gain value), while the phase can be calibrated in pairs (e.g. calibrate antenna elements 102A and 102B first, then calibrate antenna elements 102A and 102M-1 next).

After the antenna elements 102 within the set of four antenna elements have been calibrated in reference to one another, the calibration procedure may calibrate the next set of four antenna elements 102. Antenna elements except for the antenna elements in the next set are turned off at block 526. At block 528, an antenna element that is in both the first and second set is identified. Then at block 530, the next set of antenna elements are calibrated with the identified antenna element as a reference. The next set of four antenna elements 102 may be equidistant from the next probe 310B. The same or a different calibration method may be used for the next set of four antenna elements 102. After the sets of antenna elements 102 across the row of elements are calculated, the process can be repeated for the following column of a set of four antenna elements 102. For example, after the set of antenna elements 102 have been calibrated using the probes 310A, 310B, and 310C, then the next set of four antenna elements 102 to be calibrated may be those that are equidistant from the probe 310M.

Once the power values are calibrated, the transmitter connected to the antenna element 102A and the transmitter connected to the antenna element 102B are turned on. Based on the power calibration, the antenna elements 102A and 102B transmit signals at substantially the same power level. Adjust one or both of the phase adjuster 244A or 244B. The probe 310A will receive both signals from antenna elements 102A and 102B and detect the power values at the power detector 312A. When the power is maximized, the phase adjuster 244A and 244B are aligned (e.g. the phase values are equal). When the power is minimized, the phase adjuster 244A and 244B are opposite (e.g. phase of one equals the phase of the other plus 180 degrees). Using this relative relationship, the system can calibrate the phase of one antenna element relative to the other antenna element.

Figure 6A:
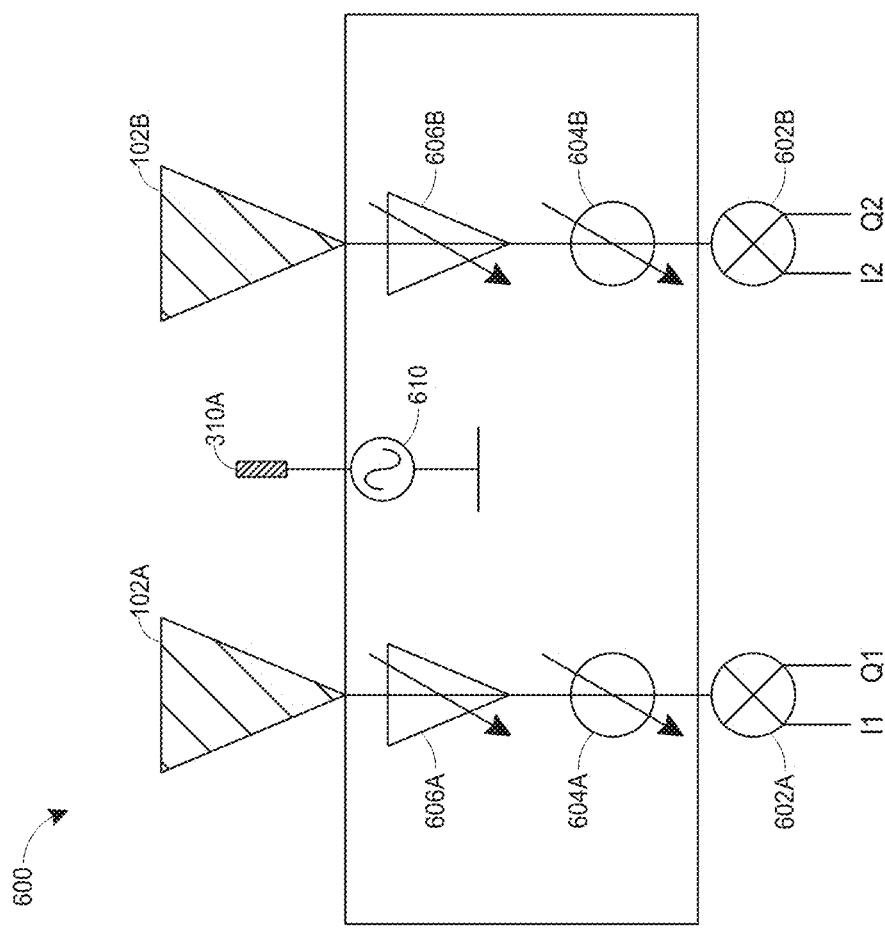
FIG. 6A is a schematic block diagram of a probe with an RF power source disposed between two antenna elements according to an embodiment.

FIG. 6A is a schematic block diagram of a probe 310A with an RF power source 610 disposed between two antenna elements 102A, 102B according to an embodiment. In this block diagram 600, the probe 310A is disposed equidistant between the two antenna elements 102A, 102B. The probe 310A may transmit a signal for the antenna elements 102A and 102B to receive.

Figure 6B:
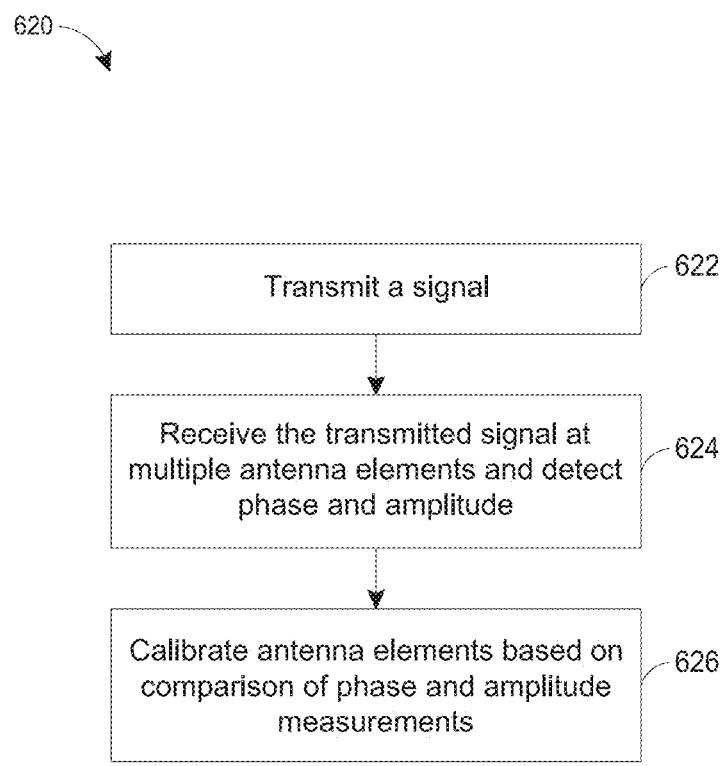
FIG. 6B is a flow diagram for calibration using a probe with an RF power source disposed between two antenna elements according to an embodiment.

FIG. 6B is a flow diagram for calibration using a probe with an RF power source disposed between two antenna elements according to an embodiment. At block 622, the probe 310A is a radiating element that transmits a signal. The probe 310A can be connected to an RF power source 610. At block 624, the antenna elements 102A, 102B receives the signal transmitted from the probe 310A. The antenna elements 102A, 102B can be connected to a phase adjuster 604A and 604B, the variable gain amplifier 606A, 606B, and an I/Q mixer 602A, 602B. The antenna elements 102A, 102B receives the signal and detects the phase and amplitude using the I/Q mixer 602A, 602B. At block 626, the antenna elements are calibrated based on a comparison of the detected phase and amplitude measurements.

Figure 7:
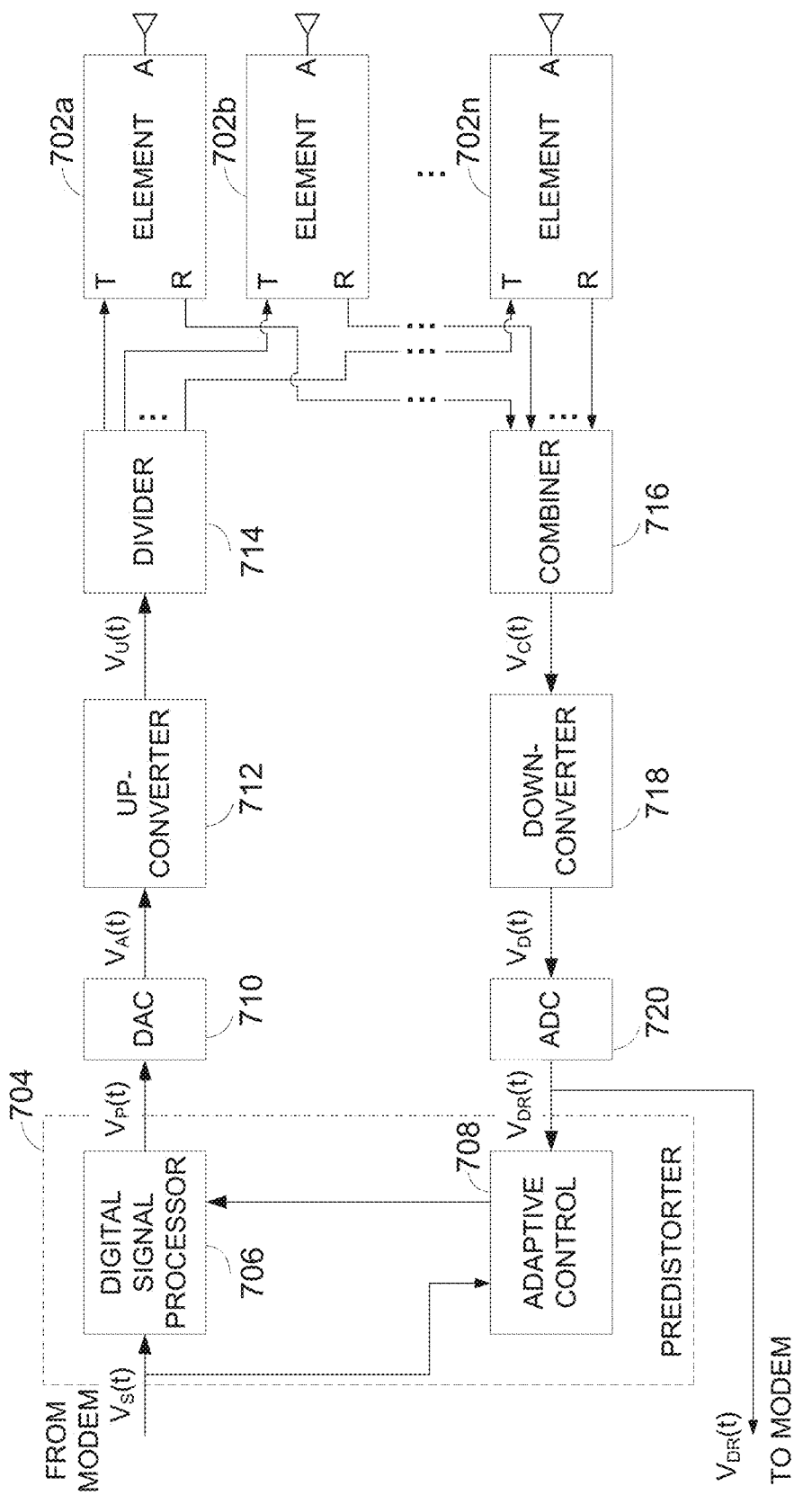
FIG. 7 illustrates a phased array with predistortion.

FIG. 7 illustrates a phased array with predistortion linearization. In one embodiment, the phased array corresponds to an analog phased array or to a hybrid phased array and is used in connection with a time-division duplex (TDD) communication system, such as a mobile phone base station. Other systems, such as radar systems, are also applicable. As will be explained in greater detail later in connection with FIGS. 8A-8C, the phased array elements 702a-702n can include phase shifters and variable gain amplifiers to adjust a pattern or "beam" of the phased array for both transmitting and receiving. In some embodiments, the amount of phase shift and gain adjustment to be applied to each phased array element for a desired pattern can be determined by the techniques described earlier in connection with FIGS. 1A to 6B. However, other techniques can alternatively be used.

A predistorter 704 includes a digital signal processor (DSP) 706 and an adaptive control 708. An input signal $V_S(t)$ is provided as an input to the DSP 706. For example, the input signal $V_S(t)$ can be generated by a modulator of a modem and correspond to a baseband complex modulation envelope. The DSP 706 can perform predistortion on the input signal $V_S(t)$ on a sample-by-sample basis to generate a predistorted drive signal $V_P(t)$ that complements the nonlinearities collectively introduced by the RF power amplifiers of the phased array elements 702a-702n. In the illustrated embodiment, the same predistortion provided by the predistorter 704 is applied to multiple or to all RF power amplifiers of the phased array elements 702a-702n of the phased array.

A wide variety of algorithms can be used for predistortion. Moreover, the DSP 706 can correspond to a wide variety of signal processing circuits, such as, but not limited to, a finite impulse response (FIR) filter, a lookup table, or the like. The manner by which the DSP 706 predistorts the input signal $V_S(t)$ is determined by the particular predistortion algorithm being implemented and the coefficients within the DSP 706. The adaptive control 708 can compare samples of the input signal $V_S(t)$ with corresponding samples of a digital feedback signal $V_{DR}(t)$ to determine appropriate coefficients for predistortion that are applied by the DSP 706. These appropriate coefficients can vary with different amplifiers, over time, over temperature, over different drive levels, over varying beam pattern, or the like, and can be adaptively adjusted as needed by the adaptive control 708. For discussions on predistortion and adaptive adjustment, see, for example, NAGATA, Y., *Linear Amplification Technique for Digital Mobile Communications*, IEEE Vehicular Technology Conference (1989), pgs. 159-164; and CAVERS, J. K., *Amplifier Linearization Using A Digital Predistorter With Fast Adaptation And Low Memory Requirements*, IEEE Transactions on Vehicular Technology, Vol. 39, No. 4, pp. 374-383, November 1990.

Adaptive adjustment and the collection of RF samples for adaptive adjustment need not be performed continuously and can instead be performed sporadically, such as periodically, or in response to changes, such as changes to beam angle/antenna pattern/gain/power levels.

The DSP 706 can be implemented in hardware, such as in an application specific integrated circuit (ASIC), a field-programmable gate array (FPGA), or the like. Portions of the adaptive control 708 can be implemented in software/firmware by a processor executing machine-readable instructions for the particular predistortion algorithm. The computations performed by the adaptive control 708 do not need to be performed in real time and can be performed using data stored in and retrieved from a memory device.

A digital-to-analog converter (DAC) 710 converts the predistorted drive signal $V_P(t)$ from a digital form to an analog form and provides an analog predistorted drive signal $V_A(t)$ as an input to an upconverter 712. The upconverter 712 converts the analog predistorted drive signal $V_A(t)$ to an upconverted signal $V_U(t)$. In the illustrated embodiment, the analog predistorted drive signal $V_A(t)$ is a baseband signal, and the upconverted signal $V_U(t)$ is a higher-frequency signal, and can be, for example, radio frequency, microwave frequency, millimeter wave (RF/MW/mmw). In the context of this disclosure, the term radio frequency (RF) will include, but is not limited to, microwave and millimeter wave frequencies. In one example, the upconverter 712 can correspond to a quadrature upconverter. Other types of upconverters can be used. The upconverter 712 can include, for example, a mixer, a filter, and a variable gain amplifier.

The upconverted signal $V_U(t)$ is provided as an input to a power divider 714, which can include one or more Wilkinson power dividers. In contrast to conventional TDD systems, in some embodiments, the power divider 714 is dedicated to the transmit/forward path and is not used for the receive/return path. The power divider 714 provides the multiple phased array elements 702a-702n with the same predistorted signal as a drive signal.

The phased array elements 702a-702n include the RF power amplifiers to be linearized as well as other components. The number of phased array elements 702a-702n in the phased array can vary in a very broad range. While not restricted to a power of 2, a number that is a power of 2 can be easier to implement. In one example, the number of phased array elements 702a-702n is in a range between 16 and 1024. In some embodiments, each of the phased array elements 702a-702n can be manufactured to be identical to each other, but can vary during operation with different phase shifter and or gain/power settings. The phased array elements 702a-702n can have a transmit terminal T, a receive/return terminal R, and an antenna element terminal T. In contrast to a conventional phased array element for a TDD system, the transmit and receive/return paths in some embodiments of the invention can be separated or dedicated. This advantageously provides relatively large cost and size improvements over systems in which each RF amplifier of a phased array has its own predistortion linearization. For clarity, other terminals such as power and control terminals are not shown. Various embodiments for the phased array elements 702a-702n will be described in greater detail later in connection with FIGS. 8A-8C.

In the illustrated embodiment, the return/receive paths are the same paths and are separate from the forward/transmit paths. In some embodiments, each receive path adjusts the phase of its received signal, such that all received signals are added in-phase. Amplitude adjustment in the receive path is also possible, to compensate for path mismatches, if any. A hardware RF power combiner 716 combines the signals from the return/receive paths to generate a combined signal $V_c(t)$, which is provided as an input to a downconverter 718. During a transmit phase, the return/receive paths can carry RF sample signals. During a receive phase, the return/receive paths can carry received signals, such as signals transmitted by mobile phones. In some embodiments, the hardware RF power combiner 716 can include one or more Wilkinson combiners. The hardware RF power combiner 716 does not correspond to a multiplexer.

The downconverter 718 converts the combined signal Vc(t), which is an RF signal, to a downconverted signal $V_D(t)$, which can be a baseband or intermediate frequency signal. The downconverter 718 can include a mixer and a filter, and in some embodiments, can include additional amplifiers. The downconverted signal $V_D(t)$ is provided as an input to an analog-to-digital converter (ADC) 720, which converts the downconverted signal $V_D(t)$ to a digital downconverted signal $V_{DR}(t)$.

When the phased array is transmitting, selected samples of the digital downconverted signal $V_{DR}(t)$ can be collected for analysis for adaptive adjustment of predistortion. When the phased array is receiving, the digital downconverted signal $V_{DR}(t)$ can, for example, be provided as an input to a demodulator of the modem (not shown) to generate received data.

The adaptive control 708 can compare samples of the input signal $V_S(t)$ with corresponding samples of the digital downconverted signal $V_{DR}(t)$ to estimate the predistortion coefficients. For example, the samples from the input signal $V_S(t)$ can be scaled, rotated, and delayed to align with the samples of the digital downconverted signal $V_{DR}(t)$. In one example, an adaptive algorithm can tune its predistortion coefficients to minimize the total error (such as mean-squared error) between the input signal $V_S(t)$ and the digital downconverted signal $V_{DR}(t)$.

Figure 8A:
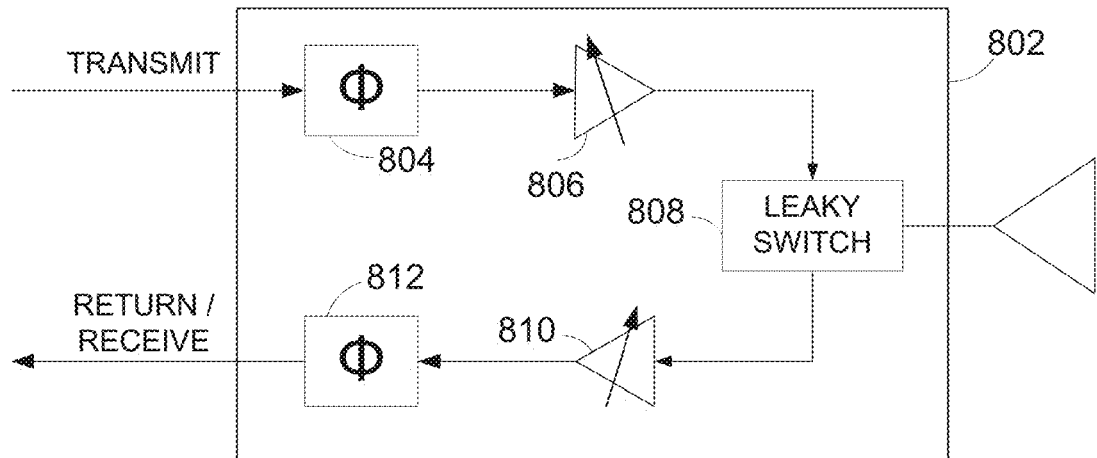
FIG. 8A illustrates an embodiment of a phased array element.
Figure 8B:
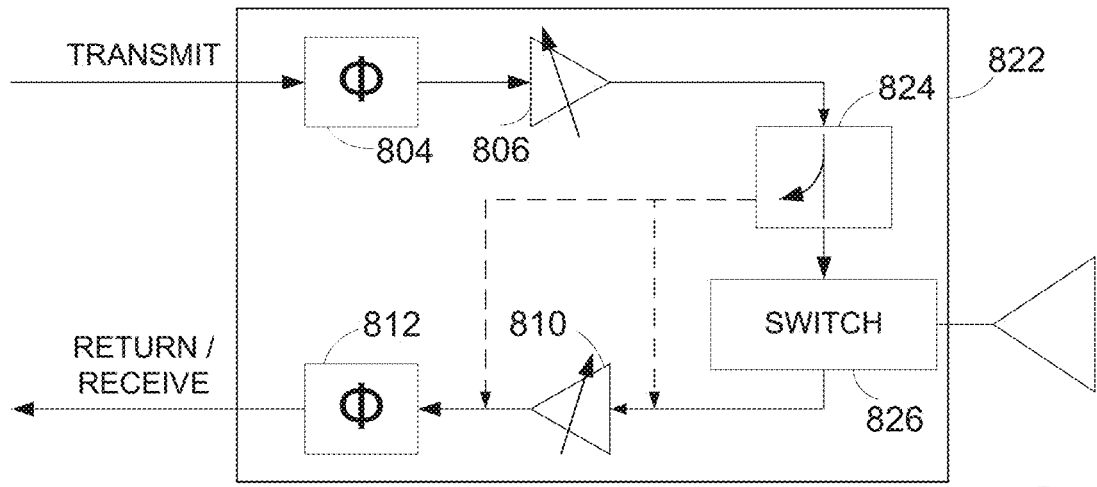
FIG. 8B illustrates another embodiment of a phased array element.
Figure 8C:
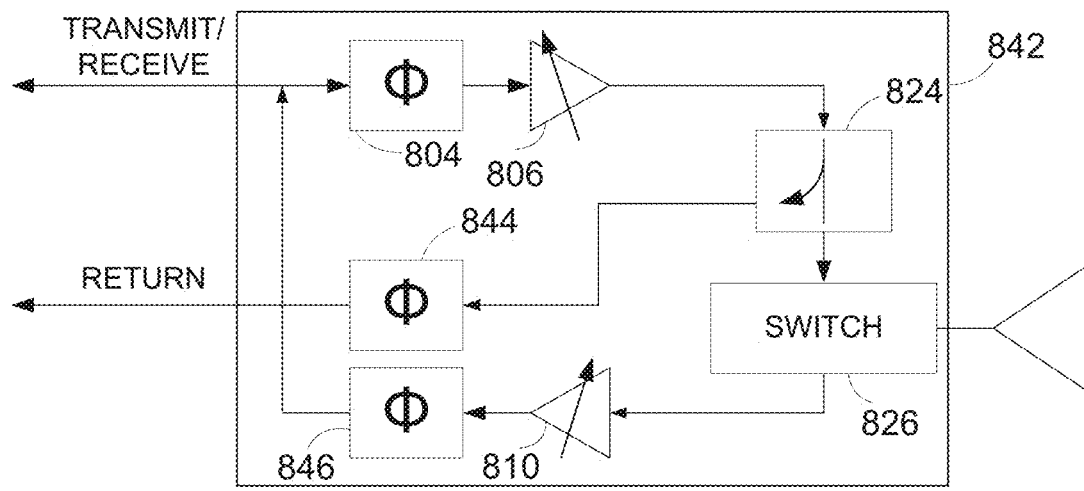
FIG. 8C illustrates another embodiment of a phased array element.

FIGS. 8A-8C illustrate various embodiments of phased array elements 802, 822, 842. Other variations are possible. These phased array elements 802, 822, 842 can be used for any of the phased array elements 702a-702n described earlier in connection with FIG. 7. To avoid repetition of description, components having the same or similar function may be referenced by the same reference number.

In the embodiment illustrated in FIG. 8A, the transmit path and the receive/return path are separate. In a TDD system, transmitting and receiving occur at different times. When transmitting, the return/receive path can be used for providing RF samples of the transmitted signal. When receiving, the return/receive path is used to provide received signals. The phased array element 802 includes a transmit-side phase shifter 804, a variable gain RF power amplifier 806, a leaky switch 808, a low-noise amplifier (LNA) 810, and a return-side phase shifter 812. The amount of phase shift provided by the transmit-side phase shifter 804 and the amount of gain of the variable gain RF power amplifier 806 are determined based on the antenna pattern or beamforming desired.

When transmitting, a relatively small amount of the transmitted power can be leaked across the leaky switch 808 from the transmit side to the return/receive side for collection of RF samples for adaptive adjustment. Ordinarily, the leaky switch 808 selects either the transmit side or the return/receive side for the antenna element. An appropriate amount of leakage between the transmit side and the return/receive side can be specified and deliberately introduced for the leaky switch 808. The amount of leakage that will be applicable can vary in a very broad range and can vary with an amount of gain provided by the LNA 810. This leaked power provides the return/receive side with an RF sample of the transmitted signal.

The LNA 810 can be present in the return/receive path for reception of signals from other sources, such as mobile phones, but is not needed for the RF sampling of the transmitted signal. During RF sampling, the gain of the LNAs 810 of the plurality of phased array elements 802 can be the same. During operation, the return-side phase shifter 812 can have different settings depending on whether the return/receive paths are being used for collection of RF samples for adaptive adjustment of predistortion or are being used for receiving.

When the return/receive paths are being used for collection of RF samples, the return-side phase shifters should be adjusted such that the return path signals are aligned in phase at the hardware RF power combiner 716 (FIG. 7). In some embodiments, this can mean that the return-side phase shifter 812 effectively performs the opposite phase shift to the phase shift of the transmit-side phase shifter 804. It will be understood that there can be variations in path lengths that can need to be taken into account by additional offsets. These variations can be determined during a manufacturing or calibration process and stored in a lookup table. When the return/receive paths are being used for receiving, the return-side phase shifters 812 can be adjusted to implement the desired antenna pattern.

In the embodiment illustrated in FIG. 8B, transmit path and receive/return path are again separate or dedicated paths. The phased array element 822 includes a transmit-side phase shifter 804, a variable gain RF power amplifier 806, a directional coupler 824, a switch 826, a low-noise amplifier (LNA) 810, and a return-side phase shifter 812. In a TDD system, the switch 826 selects the transmit side for the antenna element when transmitting, and the switch 826 selects the receive side for the antenna element when receiving.

When transmitting, a relatively small amount of the transmitted power (known as an RF sample) is coupled via the directional coupler 824 from the transmit side to the return/receive side for collection of RF samples for adaptive adjustment. The coupling factor is not critical. For example, the coupling factor can be −10 decibels (dB), −20 dB, or the like. Other amounts are applicable for the coupling factor and will be readily determined by one of ordinary skill in the art. However, in some embodiments, the coupling factor is about the same for the directional couplers 824 of the phased array. The RF samples from the coupled output can be provided to the return/receive path ahead of or behind the LNA 810, but should be provided ahead of the return-side phase shifter 812. For example, switches can be used to provide the RF samples to the desired points in the signal path.

As described earlier in connection with FIG. 8A, when the return/receive paths are being used for collection of RF samples, the return-side phase shifters 812 should be adjusted such that the return path signals are aligned in phase at the hardware RF power combiner 716 (FIG. 7). When the return/receive paths are being used for receiving, the return-side phase shifters 812 can be adjusted to implement the desired antenna pattern.

In the embodiment illustrated in FIG. 8C, transmit path and the receive path can be the same, and a dedicated return path can provide RF samples for adaptive adjustment. The phased array element 842 includes a transmit-side phase shifter 804, a variable gain RF power amplifier 806, a directional coupler 824, a switch 826, a low-noise amplifier (LNA) 810, a return-side phase shifter 844, and a receive-path phase shifter 846.

In the embodiment illustrated in FIG. 8C, the transmit and receive operations can be similar to those found in conventional phased array elements. The power divider 714 can provide combining functions for the receive path, and components such as the downconverter 718 and ADC 720 can be duplicated for the receive path and the return path, as the receive path and the return path are separate in FIG. 8C.

The directional coupler 824 provides the RF samples to the return-side phase shifter 844, which can be adjusted such that the return path signals are aligned in phase at the hardware RF power combiner 716 (FIG. 7). The gain of the LNA 810 and the phase of the receive-path phase shifter 846 can be adjusted based on the desired antenna pattern or beamforming.

Figure 9:
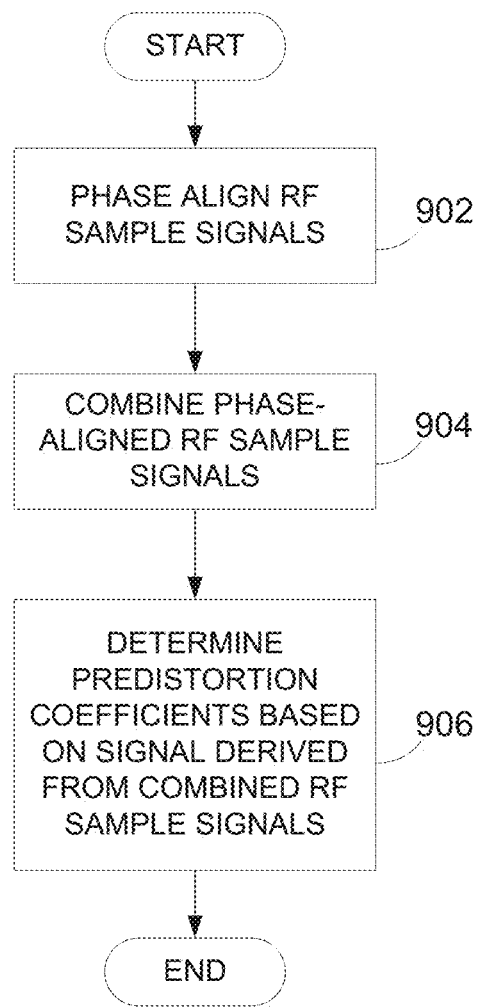
FIG. 9 illustrates a method of arranging signal for collection of data for the determination of predistortion coefficients.

FIG. 9 illustrates a method of arranging signal for collection of data for the determination of predistortion coefficients. The process adjusts the phase of the RF sample signals such that the RF sample signals are phase aligned 902 at the hardware RF power combiner 716 (FIG. 7). The phase alignment can be accomplished by providing phase adjustments to the phase shifters 812, 844 (FIGS. 8A-8C). These phase-aligned RF sample signals are combined 904 in the hardware RF power combiner 716 of the phased array to generate a combined signal. The adaptive adjustment algorithm can then determine 906 the appropriate predistortion coefficients to use based on comparisons between portions of the input signal and corresponding portions of a signal derived from the combined signal, such as from corresponding portions of a downconverted and digitally converted version of the combined signal.

Any of the principles and advantages discussed herein can be implemented in connection with any other systems, apparatus, or methods that benefit could from any of the teachings herein. For instance, any of the principles and advantages discussed herein can be implemented in connection with any devices with a need to adjust the amplitude or phase of a phased array.

Aspects of this disclosure can be implemented in various electronic devices. For instance, one or more of the above phased array embodiments can implemented in accordance with any of the principles and advantages discussed herein can be included in various electronic devices. Examples of the electronic devices can include, but are not limited to, cell phone base stations, radar systems, radar detectors, consumer electronic products, parts of the consumer electronic products such as semiconductor die and/or packaged modules, electronic test equipment, etc. Examples of the electronic devices can also include communication networks. The consumer electronic products can include, but are not limited to, a phone such as a smart phone, a laptop computer, a tablet computer, a wearable computing device such as a smart watch or an ear piece, an automobile, a camcorder, a camera, a digital camera, a portable memory chip, a washer, a dryer, a washer/dryer, a copier, a facsimile machine, a scanner, a multifunctional peripheral device, a wireless access point, a router, etc. Further, the electronic device can include unfinished products, including those for industrial and/or medical applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). Additionally, the words "herein," "above," "below," and words of similar import, when used in this application, shall refer to this application as a whole and not to any particular portions of this application. Where the context permits, words in the Detailed Description of Certain Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An apparatus for radio frequency (RF) linearization of multiple amplifiers of a phased array, the apparatus comprising:
a plurality of return paths configured to carry at least RF sample signals of a plurality of RF power amplifiers;
a switch configured to electrically connect an antenna element to a transmit path in a first state and to electrically connect the antenna element to a receive path in a second state;
an RF coupler electrically connected in series with the switch, the RF coupler configured to generate an RF sample signal of the RF sample signals, the RF coupler further configured to (i) selectively provide the RF sample signal between an RF power amplifier and the switch, and (ii) selectively provide the RF sample signal between the RF power amplifier and a return-side phase shifter;
a hardware RF power combiner configured to combine the RF sample signals to generate a combined signal;
a plurality of return-side phase shifters configured to adjust a phase shift of the RF sample signals such that the RF sample signals are phase aligned at the hardware RF power combiner; and
a predistorter configured to predistort an input signal to generate a predistorted signal and configured to adapt predistortion coefficients for predistortion based at least partly on observations of a signal derived from the combined signal.

2. The apparatus of claim 1, wherein the plurality of phase shifters are configured to effectively perform an opposite phase shift to phase shifts of transmit-side phase shifters.

3. The apparatus of claim 1, further comprising:
a downconverter configured to convert the combined signal to a downconverted signal; and
an analog-to-digital converter configured to convert the downconverted signal to a feedback signal, wherein the feedback signal comprises the signal derived from the combined signal.

4. The apparatus of claim 3, wherein the predistorter is further configured to adapt predistortion coefficients based on a comparison between portions of the input signal and corresponding portions of the feedback signal.

5. The apparatus of claim 1, wherein the phased array further comprises:
a plurality of phased array elements comprising the plurality of RF power amplifiers, wherein phased array elements have transmit terminals and return terminals;
an RF power divider separate from the hardware RF power combiner; and
a plurality of transmit paths separate from the plurality of return paths, wherein first ends of the transmit paths are coupled to the RF power divider and second ends of the transmit paths are coupled to transmit terminals of the phased array elements;
wherein first ends of the return paths are coupled to return terminals of the phased array elements and second ends of the return paths are coupled to the hardware RF power combiner.

6. The apparatus of claim 5, wherein the RF coupler comprises a sample port that generates the RF sample signal.

7. The apparatus of claim 5, wherein phased array elements further comprise transmit-side phase shifters and the return-side phase shifters, wherein when data is being collected for adaptive adjustment, the return-side phase shifters are adjusted such that the RF sample signals are aligned in phase at the hardware RF power combiner.

8. The apparatus of claim 5, wherein the hardware RF power combiner comprises a Wilkinson combiner.

9. The apparatus of claim 1, wherein the same predistortion is applied to the plurality of RF power amplifiers of the phased array.

10. The apparatus of claim 1, wherein the predistorter is configured to adapt new predistortion coefficients in response to a change in a beamforming pattern of the phased array.

11. A method of linearization of multiple amplifiers of a phased array, the method comprising:
sampling, with respective circuit elements coupled between respective radio frequency (RF) power amplifiers and antenna elements, signals generated by the RF power amplifiers to generate RF sample signals;
providing the RF samples to hardware of respective receive paths arranged to process signals received from the antenna elements, wherein providing the RF samples comprises using hardware configured to (i) selectively provide an RF sample of the RF samples between an RF power amplifier of the RF power amplifiers and a switch, and (ii) selectively provide the RF sample between the RF power amplifier and a return-side phase shifter;
phase shifting the RF sample signals such that the RF sample signals are phase aligned at a hardware RF power combiner;
combining the RF sample signals the hardware RF power combiner to generate a combined signal; and
predistorting an input signal with a predistorter to generate a predistorted signal, wherein predistortion coefficients are based at least partly on comparisons between portions of the input signal and corresponding portions of a signal derived from the combined signal.

12. The method of claim 11, wherein adjusting phase shifters effectively performs an opposite phase shift to phase shifts of transmit-side phase shifters.

13. The method of claim 11, further comprising:
downconverting the combined signal with a downconverter to a downconverted signal; and
converting the downconverted signal with an analog-to-digital converter configured to generate a feedback signal, wherein the feedback signal comprises the signal derived from the combined signal.

14. The method of claim 11, wherein the phase shifters are disposed in signal paths between the RF power amplifiers and the hardware RF power combiner.

15. The method of claim 11, further comprising applying the same predistorted signal to the plurality of RF power amplifiers of the phased array.

16. The method of claim 11, further comprising determining new predistortion coefficients in response to a change in a beamforming pattern of the phased array.

17. The apparatus of claim 1, further comprising:
a switch for switching an antenna element between either a transmit side or a receive side for time-division duplex operation, wherein the receive side comprises the return paths.

18. The apparatus of claim 17, wherein when data is being collected for adaptive adjustment, a return side phase shifter of the plurality of return-side phase shifters is adjusted such that a first RF sample signal of the RF sample signals is aligned in phase at the hardware RF power combiner with a second RF sample signal of the RF sample signals.

19. The apparatus of claim 1, wherein the receive path and a return path of the return paths share common hardware.

20. The method of claim 11, wherein the circuit elements include RF couplers electrically connected to switches.

21. The method of claim 12, wherein the phase shifters are disposed in return paths.

22. The method of claim 11, wherein after predistorting the input signal, the amplitudes of the corresponding transmitting signals have approximately the same amplitude.

* * * * *

UNITED STATES PATENT AND TRADEMARK OFFICE
CERTIFICATE OF CORRECTION

| | |
|---|---|
| PATENT NO. | : 11,038,474 B2 |
| APPLICATION NO. | : 15/801232 |
| DATED | : June 15, 2021 |
| INVENTOR(S) | : Ahmed I. Khalil et al. |

It is certified that error appears in the above-identified patent and that said Letters Patent is hereby corrected as shown below:

In the Specification

In Column 10, Line 52, delete "FIG." and insert --FIGS.--.

In Column 13, Line 19, delete "and or" and insert --and/or--.

In Column 13, Line 40, delete "$V_c(t)$," and insert --$V_C(t)$,--.

In Column 13, Line 49, delete "Vc(t)," and insert --$V_C(t)$,--.

In the Claims

In Column 18, Claim 18, Line 65, delete "the a" and insert --a--.

Signed and Sealed this
Ninth Day of November, 2021

Drew Hirshfeld
*Performing the Functions and Duties of the
Under Secretary of Commerce for Intellectual Property and
Director of the United States Patent and Trademark Office*